United States Patent
Tanaka et al.

[11] Patent Number: 6,150,677
[45] Date of Patent: Nov. 21, 2000

[54] METHOD OF CRYSTAL GROWTH OF COMPOUND SEMICONDUCTOR, COMPOUND SEMICONDUCTOR DEVICE AND METHOD OF MANUFACTURING THE DEVICE

[75] Inventors: So Tanaka; Akihiro Moto; Tatsuya Tanabe; Nobuyuki Ikoma, all of Itami, Japan

[73] Assignee: Sumitomo Electric Industries, Ltd., Osaka, Japan

[21] Appl. No.: 09/252,124

[22] Filed: Feb. 18, 1999

[30] Foreign Application Priority Data

Feb. 19, 1998 [JP] Japan .................................. 10-037256
Mar. 24, 1998 [JP] Japan .................................. 10-075571

[51] Int. Cl.[7] .............................................. H01L 31/0304
[52] U.S. Cl. .............................. 257/201; 438/47; 438/94; 117/2; 117/3
[58] Field of Search ................................ 117/89, 954, 2, 117/3; 438/46, 47, 93, 94; 257/12, 14, 15, 21, 22, 76, 201

[56] References Cited

U.S. PATENT DOCUMENTS

| | | | |
|---|---|---|---|
| 5,244,829 | 9/1993 | Kim | 117/104 |
| 5,505,157 | 4/1996 | Hara et al. | 117/2 |
| 5,805,624 | 9/1998 | Yang et al. | 372/45 |

FOREIGN PATENT DOCUMENTS

| | | |
|---|---|---|
| 212910 A2 | 3/1987 | European Pat. Off. . |
| 06037355 | 2/1994 | Japan . |
| 06334168 | 12/1994 | Japan . |
| 09283857 | 10/1997 | Japan . |

OTHER PUBLICATIONS

Hydrogen in Semiconductors; vol. 34, "Semiconductors and Semimetals", (1991), Eds. J. Pankove et al; Academic Press, Inc. Chapter 13 and Table of Contents.

"Photoluminescence Detection of Shallow Impurity Neutralization in III–V Compound Semiconductors"; Weber et al., Mat. Res. Soc. Symp. Proc., vol. 104, pp.325–29 (1988);.

"Enhancement of Nitrogen Incorporation in GaInNAs Grown by MOVPE . . ."; 25th International Symposium on Compound Semiconductors (1998); by A. Moto et al.

"Growth of GaAsN by low–pressure metalorganic chemical vapor deposition using plasma–cracked $N_2$"; Journal of Crystal Growth 145, (1994), pp.99–103; by M. Sato.

"Fundamental aspects of vapor growth and epitaxy", Journal of Crystal Growth, 115 (1991), pp.1–11; by G. B. Stringfellow.

"Metal organic vapor phase epitaxy growth of GaAsN on GaAs using dimethylhydrazine and tertiarybutylarsine", Apply.Phys.Lett. 70(21), (1997), pp.2861–2863; by A. Ougazzaden et al.

"GaInNAs: A Novel Material for Long–Wavelength–Range Laser Diodes with Excellent High–Temperature Performance", Jpn.J.Appl.Phys., vol. 35(1996), pp.1273–1275; by Kondow et al.

"Room–Temperature Operation of GaInNAs/GaInP Double–Heterostructure Laser Diodes Grown by Metalorganic Chemical Vapor Deposition", Jpn. J. Appl.Phys., vol. 36 (1997), pp.2671–2675; Sato et al.

*Primary Examiner*—Benjamin L. Utech
*Assistant Examiner*—Donald L. Champagne
*Attorney, Agent, or Firm*—W. F. Fasse; W. G. Fasse

[57] ABSTRACT

A semiconductor layer consisting of $Ga_{1-x}In_x N_y As_{1-y}$ and/or $GaN_y As_{1-y}$ and formed by incorporating nitrogen into a group III–V mixed crystal semiconductor is provided on a GaAs substrate. The hydrogen concentration in the semiconductor is kept at $5 \times 10^{18}$ atoms/cm$^3$ or below.

8 Claims, 14 Drawing Sheets

METHOD OF CRYSTAL GROWTH OF COMPOUND SEMICONDUCTOR, COMPOUND SEMICONDUCTOR DEVICE AND METHOD OF MANUFACTURING THE DEVICE

BACKGROUND OF THE INVENTION

1. Field of the Invention

The present invention relates to a method of crystal growth of a compound semiconductor, and more specifically to a method of crystal growth of a GaInNAs-type compound semiconductor by a vapor phase growth method. The invention also relates to a compound semiconductor device having as a part of the device a $Ga_{1-x}In_xN_yAs_{1-y}$ or $GaN_yAs_{1-y}$ crystal thin film. The invention further relates to a method of manufacturing such a compound semiconductor device.

2. Description of the Background Art

First of all, the background art relating to the compound semiconductor device using GaInNAs will be described.

As mentioned earlier, in recent years, a group III–V mixed crystal semiconductor containing nitrogen as a group V element has received much attention as a novel semiconductor material. With this material, through appropriate selection of the concentrations of nitrogen and component elements, epitaxial growth without misfit dislocation on a Si, GaAs, InP, or GaP substrate is possible.

For instance, Document 1 (Japanese Patent Laying-Open No. 6-334168) describes an example in which a group III–V mixed crystal semiconductor is epitaxially grown on a Si substrate to produce an Si electronic device or the like having a monolithic structure. In addition, Document 2 (Japanese Patent Laying-Open No. 6-37355) describes the examples in which GaInNAs, AlGaNAs, or GaNAs is epitaxially grown on a GaAs, InP, or GaP substrate. Document 3 (Japanese Patent Laying-Open No.9-283857) describes an example in which a GaInNAs thin film crystal is epitaxially grown on a GaAs substrate to form a semiconductor laser.

The following is the possible advantages of forming an optical device or an electronic device using a group III–V mixed crystal semiconductor containing nitrogen on the GaAs substrate, for example, $Ga_{1-x}In_xN_yAs_{1-y}$ or $GaN_yAs_{1-y}$. Conventionally, most of the mixed crystal semiconductors, the examples of which include AlGaAs, GaInP and such, that are lattice matched to the GaAs substrate have a band gap larger than that of GaAs. Here, the new materials, $Ga_{1-x}In_xN_yAs_{1-y}$ and $GaN_yAs_{1-y}$, have the advantage of making the band gap smaller than that of GaAs.

In addition, the band gap may be advantageously altered continuously by changing the In composition x and the nitrogen concentration y for $Ga_{1-x}In_xN_yAs_{1-y}$ and the nitrogen concentration for $GaN_yAs_{1-y}$. When this material is combined with other materials to form a multi-layer structure, an optical device having a light-emitting wavelength longer than that of GaAs can be produced, which has hitherto been impossible. For instance, by using $Ga_{1-x}In_xN_yAs_{1-y}$ or $GaN_yAs_{1-y}$ for the active layer, it is possible to produce a semiconductor laser which lases at 1.3 μm or 1.55 μm used in optical fiber communications. A light-receiving diode for detecting the infrared light can also be produced.

FIGS. 1A and 1B show the example (a) of a semiconductor laser and the example (b) of a photo diode using $Ga_{0.85}In_{0.15}N_{0.05}As_{0.95}$. For the semiconductor laser, the above composition allows the lasing operation at 1.3 μm utilized for optical communications using optical fibers. $Ga_{0.85}In_{0.15}N_{0.05}As_{0.95}$ is used for an active layer. When $Ga_{0.85}In_{0.15}N_{0.05}As_{0.95}$ is used to form the p-i-n structure consisting of stacked layers of p-type having a high carrier concentration, of n-type having a low carrier concentration, and of n-type having a high carrier concentration, the light-receiving diode can detect infrared light of up to 1.3 μm.

Until now, these laser diodes and photo diodes have been formed on InP substrates. In the laser diode, InGaAsP has been used for the active layer. The InP substrate, however, is inferior to the GaAs substrate both in the aspects of mass-productivity and cost. The lasers formed on such substrates are also inferior with regard to their mass-productivity and cost.

Although $GaN_yAs_{1-y}$ does not lattice match to GaAs, the diode structure can be formed without the development of a crystal defect such as misfit dislocation by keeping the thickness sufficiently thin when $GaN_yAs_{1-y}$ is used for the active layer of a laser diode. Similarly, although misfit dislocation may occur when using $Ga_{1-x}In_xN_yAs_{1-y}$, if the selection of the x to y composition ratio is inappropriate, the development of a crystal defect can be prevented by keeping the thickness sufficiently thin.

Next, the background art relating to the method of crystal growth of a compound semiconductor will be described. In order to grow a crystal of a group III–V compound semiconductor by a vapor phase growth method, a group III source material supplying a group III element and a group V source material supplying a group V element are used.

When growing a crystal of a group III–V compound semiconductor such as a ternary GaNAs-type compound semiconductor, a nitrogen-containing group V source material supplying N and an arsenic-containing group V source material supplying As are used together as the group V source material. Conventionally, nitrogen ($N_2$) gas or, as disclosed in a Document 4 (Journal of Crystal Growth 145 (1994), pp. 99–103), a nitrogen source produced by ammonia ($NH_3$) activated by RF plasma is used as the nitrogen-containing group V source material. Moreover, arsine ($AsH_3$) is generally used as the arsenic-containing group V source material.

The use of dimethylhydrazine (DMHy) as the nitrogen-containing group V source material in place of ammonia is proposed in Document 5 (Appl. Phys. Lett. 70 (21), May 26, 1997, pp.2861–2863). Since dimethylhydrazine has a decomposition efficiency higher than that of ammonia, nitrogen atoms can be effectively incorporated into the crystal when forming a nitride mixed crystal semiconductor. In addition, Document 5 also proposes the use of tertiary-butylarsine (TBAs) in place of arsine as the arsenic-containing group V source material. Since tertiarybutylarsine has a higher decomposition efficiency than arsine, the consumption of the arsenic-containing group V source material may be advantageously reduced.

Moreover, a method of growing the crystal of a quaternary GaInNAs-type compound semiconductor as another example of a group III–V compound semiconductor is disclosed in Document 3 (Japanese Patent Laying-Open No. 9-283857). According to Document 3, an organic nitrogen compound such as dimethylhydrazine is used as the nitrogen-containing group V source material, and arsine is used as the arsenic-containing group V source material.

Now, when arsine is used as the arsenic-containing group V source material, only 50% of the arsine decomposes at 600° C. Therefore, in order to obtain a high quality compound semiconductor crystal, the crystal must be grown at a high temperature as disclosed in Document 6 (Journal of Crystal Growth 115 (1991), pp. 1–11) or the amount of arsine supplied should be increased.

If, however, the growth temperature becomes higher during the growth of a compound semiconductor crystal of GaNAs-type, GaInNAs-type or the like, the incorporation of N into the crystal is suppressed. Thus, in order to prevent N from desorbing from the crystal growing surface, the amount of the nitrogen-containing group V source material supplied must be increased.

In addition, when the amount of arsine is increased, there is a possibility of the crystalline characteristic being affected by the reaction in the gas phase between the nitrogen-containing group V source material and dimethylhydrazine or the like.

Further, the amount of source gas supplied increases in either case in which the growth temperature is raised or in which the amount of arsine supplied is increased, inducing the need to consider the problems of the exhaust gas processing and environmental pollution.

Moreover, the inventors are particularly interested in a quarternary GaInNAs-type compound semiconductor among the compound semiconductor crystals. The GaInNAs-type compound semiconductor crystal can be lattice matched to a GaAs substrate. Therefore, a long-wavelength light-emitting device can be produced by controlling the composition of each element of Ga, In, N, and As.

The growth of a quarternary GaInNAs-type compound semiconductor crystal, however, involves a problem not found in a ternary GaAsN-type compound semiconductor, as will be described below.

Specifically, the inventors have found, as a result of the numerous experiments performed with regard to the growth of the GaInNAs-type compound semiconductor crystal, that it becomes more difficult for N to be incorporated into the crystal as the composition ratio of In in the crystal becomes higher, as described in Document 7 (A. Moto et al., "Enhancement of Nitrogen Incorporation in GaInNAs Grown by MOVPE Using Tertiary-butylarsine and Dimethylhydrazine," 25th International Symposium on Compound Semiconductors, Oct. 13, 1998 (Nara)). A similar problem is perceived in relation to the ternary GaInN-type compound semiconductor crystal which has the potential as a material for a blue laser device. In this latter case, it is observed that In is less easily incorporated into the crystal since the only group V element forming the crystal is N. This problem, however, is all together a different kind of a problem from that of the N incorporation described above.

As reported in Document 7, in order to incorporate N into the crystal effectively even when the composition ratio of In is high in the growth of the quarternary GaInNAs-type compound semiconductor crystal, there is a need either to increase the supply ratio of the nitrogen-containing group V source material to the arsenic-containing group V source material or to lower the growth temperature of the crystal so as to suppress the desorption of N from the crystal growing surface.

The approach of increasing the supplied amount of the nitrogen-containing group V source material or decreasing the supplied amount of the arsenic-containing group V source material can be considered in order to increase the supply ratio of the nitrogen-containing group V source material. From the cost and the environmental protection viewpoint, decreasing the supplied amount of the arsenic-containing group V source material is preferred. As described above, however, arsine used as the arsenic-containing group V source material has a poor decomposition efficiency. Therefore, decrease in the amount of arsine supplied may possibly lead to degradation in the crystal characteristic.

On the other hand, lowering the growth temperature of the crystal similarly retards decomposition of arsine, leading to the degradation of the crystal characteristic.

The growth of this material has been effected by molecular beam epitaxy (MBE) using a gas source material or by the organo-metallic chemical vapor deposition (OMCVD) method. It has been found that the optical characteristic deteriorates when the concentration of nitrogen is increased.

One method of determining the quality of the optical characteristic involves measuring the luminescence characteristic (photoluminescence). $Ga_{1-x}In_x N_yAs_{1-y}$ and $GaN_yAs_{1-y}$ are generally evaluated by first directing a laser beam generated by an argon laser and having a wavelength of 514 nm into the crystal and thereafter measuring the intensity of luminescence emitted from the crystal.

The presence of defects or impurities in the crystal obstructs luminescence, causing the weakening of the intensity. Thus, by measuring the intensity, the quality of the optical characteristic can be determined. Moreover, the spread around the wavelength of luminescence (generally referred to as the peak half-width) correlates with the quality of the crystalline characteristic. A narrow peak half-width indicates a favorable crystalline characteristic.

Table 1 shows the correlation (measured at room temperature), as observed by the inventors, between the nitrogen composition and the luminescence intensity of $GaN_xAs_{1-x}$ not containing In and grown at 530° C. It is appreciated from Table 1 that the luminescence intensity rapidly weakens and the optical characteristic deteriorates as the concentration of nitrogen increases. When the nitrogen concentration is high, no luminescence is detected.

TABLE 1

Correlation between nitrogen composition and luminescence intensity of GaNAs grown at 530° C. (measured at room temperature)

| Nitrogen Concentration (%) | Luminescence Intensity (Arbitrary Unit) |
| --- | --- |
| 0.09 | 19.2 |
| 0.15 | 11.2 |
| 0.34 | 3.28 |
| 0.51 | 0 |
| 2.73 | 0 |

Table 2 shows the correlation (measured at room temperature) between the nitrogen composition y and the luminescence intensity of $Ga_{0.965}In_{0.05}N_yAs_{1-y}$ grown at 530° C.

TABLE 2

Correlation between nitrogen composition and luminescence intensity of GaInNAs grown at 530° C. (measured at room temperature)

| Nitrogen Concentration (%) | | Luminescence Intensity (Arbitrary Unit) |
| --- | --- | --- |
| 0 | GaInAs | 20.3 |
| 3.5 | GaInNAs | 0 |

In = 0.1, N = 0.035

It is apparent from Table 2 that luminescence similar to that depicted above is detected in GaInNAs.

Table 3 shows the correlation (measured at room temperature) of the nitrogen composition and the specific resistance of GaNAs grown at 530° C.

TABLE 3

Correlation between nitrogen composition and specific resistance of GaNAs grown at 530° C. (measured at room temperature)

| Nitrogen Concentration (%) | Specific Resistance (Ωcm) |
|---|---|
| 0.09 | 0.52 |
| 0.15 | 1.83 |
| 0.34 | 68.8 |
| 0.51 | (*) |
| 2.73 | (*) |

(*) indicates that specific resistance is larger than 400 Ωcm, which cannot be measured.

Table 4 shows the correlation (measured at room temperature) between the nitrogen composition and the specific resistance of GaInNAs grown at 530° C.

TABLE 4

Correlation between nitrogen composition and specific resistance of GaInNAs grown at 530° C. (measured at room temperature)

| Nitrogen Concentration (%) | | Specific Resistance (Ωcm) |
|---|---|---|
| 0 | GaInAs | 8.88 |
| 3.5 | GaInNAs | (*) |

In = 0.1, N = 0.035
(*) indicates that specific resistance is larger than 400 Ωcm, which cannot be measured.

As seen from Tables 3 and 4, the specific resistance of $GaN_xAs_{1-x}$ and $Ga_{1-x}In_xN_yAs_{1-y}$ increases as the concentration of nitrogen increases, leading to the deterioration of the electrical characteristic.

Thus, when a thin film crystal having poor optical and electrical characteristics is used as the light-emitting device described above, the device undergoes a significant deterioration in its performance characteristic and reliability. In the case in which such a thin film crystal is used as a light-receiving device, its light-receiving sensitivity becomes so low that weak light cannot be detected. In addition, in the light-emitting device, the intensity of the emitted light becomes weak. Further, particularly in a semiconductor laser, continuous lasing operation becomes impossible. In both the cases of the light-emitting or light-receiving device and the electrical device, the device may not electrically operate if a layer having a high resistivity exists in the multi-layer film.

As shown in the above Document 3, as described in the above-mentioned growth method, when growing the $Ga_{1-x}In_x N_yAs_{1-y}$ thin film crystal, As atoms can easily be desorbed from the surface of the thin film and the substrate. Thus, the growth at a low temperature is required to prevent the desorption. At such a low temperature, the desorption of -arsenic can be prevented and at the same time, the nitrogen source material more readily adsorbs to the crystal surface, advantageously leading to a higher nitrogen concentration. On the other hand, impurities also readily adsorb to the surface, which leads to an increase in the impurity concentration within the crystal in proportion to the increase in the nitrogen concentration.

In particular, in the organo-metallic chemical vapor deposition (OMCVD) method, many of the organic source gases used contain gas molecules consisting of hydrogen atoms. As a result, there is a problem of hydrogen being incorporated into the thin film crystal. The possible ways in which the contamination of hydrogen occurs may include the incorporation of the source gas itself, of the intermediate product produced during the decomposition of the source gas, or of the hydrogen atoms which have decomposed from the source material into the thin film crystal. It is considered that this hydrogen acts as an impurity to deteriorate the optical and electrical characteristics. Although no reports have been made with regard to hydrogen degrading the above characteristics within $Ga_{1-x}In_x N_yAs_{1-y}$ crystal or $GaN_yAs_{1-y}$ crystal, there have been instances in which such degradation was observed with other group III–V compound crystal semiconductors.

One reported example shows that hydrogen bonds with the doping atoms in a GaAs crystal, neutralizing the positive or negative charge of the doping atoms and becoming electrically inactive (J. I. Pankove, N. M. Johnson: Hydrogen in Semiconductors, 1991, Academic Press, Inc.). Moreover, another example is reported in which the optical characteristic is degraded as a result of N atoms within a GaP crystal binding with hydrogen (Jorg Weber, et al.: Mat. Res. Soc. Symp. Proc. Vol. 104, pp. 325). The mechanism of hydrogen atoms causing the degradation of the optical characteristic is yet to be investigated.

SUMMARY OF THE INVENTION

Thus, one object of the present invention is to provide a method which solves the above-described problems and enables the stable growth and the mass-production of a GaInNAs-type compound semiconductor crystal having an excellent crystal characteristic.

Another object of the present invention is to provide a compound semiconductor device, sufficient for practical use, having a $Ga_{1-x}In_x N_yAs_{1-y}$ or $GaN_yAs_{1-y}$ crystal of high optical and electrical characteristics containing only a small amount of hydrogen impurity.

Still another object of the present invention is to provide a manufacturing method which allows the production of an optical device having favorable electrical and optical characteristics by the heat treatment which breaks the nitrogen-hydrogen bonds or by the heat treatment which decreases the nitrogen concentration that permits the improvement in the quality of the crystal even with a large amount of hydrogen impurity being present.

Yet another object of the present invention is to provide a manufacturing method with which a desirable crystal is produced and which solves the inherent problems of a nitride crystal by heat treatment, even with a small amount of hydrogen impurity being present.

Still further object of the present invention is to provide a manufacturing method which, by performing heat treatment directly after crystal growth, allows the mass-production of the device and advantageously reduces the time and energy involved in the crystal growth.

Aimed at achieving the above-described objects, the method of crystal growth for a compound semiconductor according to one aspect of the present invention involves growing a crystal of a compound semiconductor represented by $Ga_{1-x}In_x N_yAs_{1-y}$ (0<x<1, 0<y<1) by a vapor phase growth method using group III source material and group V source material, which is the combination of a nitrogen-containing group V source material and an arsenic-containing group V source material. The arsenic-containing group V source material is an organic group V compound gas.

In the present specification, the term "organic group V compound gas" refers specifically to the compound, among the group V compound containing As, having an organic group such as the methyl-group or the ethyl-group.

According to the present invention, when effecting the crystal growth for a GaInNAs-type compound semiconductor, an organic group V compound gas having superior decomposition efficiency is used as the arsenic-containing group V source material. Thus, a crystal having a good characteristic may be grown from a smaller amount of supplied source material than in the conventional case in which arsine is widely used.

Specific examples of the organic group V compound gases include tertiary-butylarsine (TBAs) and trimethylarsenic (TMAs) among others. Tertiary-butylarsine and trimethylarsenic are both liquid at room temperature, and are normally stored in stainless steel (SUS) vessels. By bubbling them with a so-called carrier gas such as hydrogen ($H_2$) gas, they can be conveyed as source gas used for the growth of a semiconductor crystal.

In addition, according to the present invention, the examples of nitrogen-containing group V source material include monomethylhydrazine (MMHy) and dimethylhydrazine (DMHy) among others. Their excellent decomposition efficiency permits the growth of a crystal having a good characteristic with a smaller amount of supplied source material.

Moreover, according to the present invention, the molar supply ratio of the arsenic-containing group V source material to the group III source material, preferably, is 1<[arsenic-containing group V source material]/[group III source material]. If the molar supply ratio of the source material represented by [arsenic-containing group V source material]/[group III source material] becomes less than or equal to 1, the degradation of the crystal characteristic occurs.

On the other hand, crystals having a favorable characteristic can be grown when the molar supply ratio of source material is greater than 1. Conventionally, there was a need to increase the source material molar supply ratio up to approximately 16 when using arsine. According to the present invention, however, the amount of the arsenic-containing group V source material to be supplied can be reduced owing to the use of an organic group V compound gas. The characteristic of a nitrogen-containing group V source material crystal, however, may deteriorate as the source material molar supply ratio becomes greater than 10. Therefore, according to the present invention, the molar supply ratio of the arsenic-containing group V source material to group III source material is preferably greater than 1 and less than or equal to 10.

Furthermore, according to the present invention, the preferred growth temperature is from 500° C. to 600° C.

In accordance with another aspect of the present invention, the compound semiconductor device is provided with a GaAs semiconductor substrate. On the GaAs semiconductor substrate, a semiconductor layer formed by incorporating nitrogen into a group III–V compound crystal semiconductor and consisting of $Ga_{1-x}In_x N_y As_{1-y}$ ($0<x\leq0.35$, $0<y\leq0.15$) and/or $GaN_y As_{1-y}$ ($0<y\leq0.07$) is provided. The nitrogen concentration in this semiconductor layer is kept at $5\times10^{18}$ atoms/cm$^3$ or below.

In accordance with still another aspect of the present invention, the method of manufacturing the compound semiconductor device involves first preparing a GaAs semiconductor substrate. On the GaAs substrate, a semiconductor layer consisting of $Ga_{1-x}In_x N_y As_{1-y}$ ($0<x\leq0.35$, $0<y\leq0.15$) and/or $GaN_y As_{1-y}$ ($0<y\leq0.15$), formed by incorporating nitrogen into a group III–V mixed crystal semiconductor, and containing $5\times10^{18}$ atoms/cm$^3$ or more of hydrogen is formed. The semiconductor layer is heat treated at a temperature from 800° C. to 1100° C. in a non-oxidizing atmosphere, an arsenic-type gas atmosphere, a phosphorus-type gas atmosphere, or in vacuum, thereby reducing the concentration of hydrogen impurity within the semiconductor device.

In accordance with yet another aspect of the present invention, the method of manufacturing the compound semiconductor device involves first preparing a GaAs semiconductor substrate. On the GaAs substrate, a semiconductor layer consisting of $Ga_{1-x}In_x N_y As_{1-y}$ ($0<x\leq0.35$, $0<y\leq0.15$) and/or $GaN_y As_{1-y}$ ($0<y\leq0.15$), formed by incorporating nitrogen into a group III–V mixed crystal semiconductor, and containing $5\times10^{18}$ atoms/cm$^3$ or more of hydrogen is formed. The semiconductor layer is heat treated at a temperature in the range of 500° C. or above and below 800° C. in a non-oxidizing atmosphere, an arsenic-type gas atmosphere, a phosphorus-type gas atmosphere, or in vacuum, thereby breaking the bond between nitrogen and hydrogen impurity within the semiconductor layer.

In accordance with a further aspect of the present invention, the method of manufacturing the compound semiconductor device involves first preparing a GaAs semiconductor substrate. On the GaAs semiconductor substrate, a semiconductor layer consisting of $Ga_{1-x}In_x N_y As_{1-y}$ ($0<x\leq0.35$, $0<y\leq0.15$) and/or $GaN_y As_{1-y}$ ($0<y\leq0.07$), formed by incorporating nitrogen into a group III–V mixed crystal substrate, and having a hydrogen concentration kept below $5\times10^{18}$ atoms/cm$^3$ is formed. The semiconductor layer is heat treated at a temperature of 500° C. or above and below 1100° C. in a non-oxidizing atmosphere, an arsenic-type gas atmosphere, a phosphorus-type gas atmosphere, or in vacuum, thereby bringing about the improvement in crystal and optical characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below in relation to the drawings.

First embodiment

Figure 2:
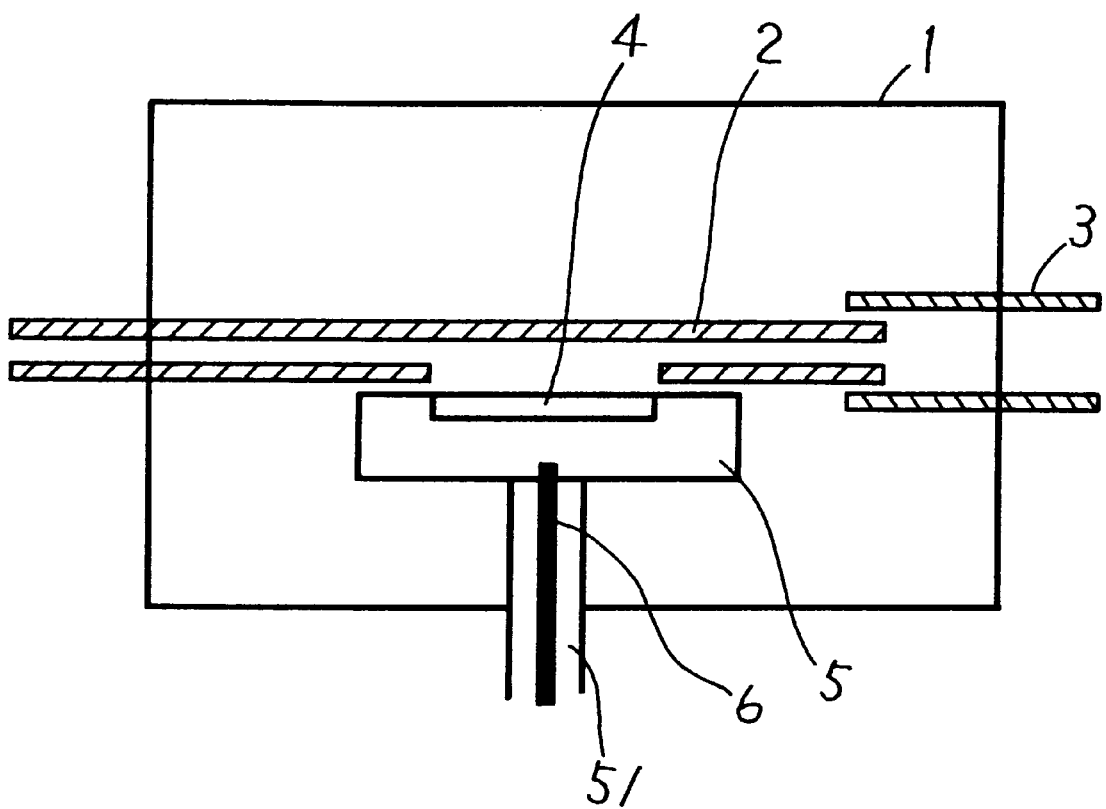
FIG. 2 is a cross sectional view showing an exemplary configuration of a vapor growth device for carrying out the method of crystal growth for the compound semiconductor according to the first embodiment.

FIG. 2 is a cross sectional view showing an exemplary configuration of a vapor phase growth device for carrying out the method of crystal growth for the compound semiconductor according to the first embodiment.

Although a horizontal reaction furnace is shown in the accompanying drawing, a vertical reaction furnace can alternatively be used to realize the embodiment according to the present invention.

In FIG. 2, the vapor growth device is provided with a stainless steel (SUS) chamber 1 for performing the vapor growth, a quartz flow channel 2 for supplying the source gas, and an exhaust tube 3. A SiC-coated carbon susceptor 5 for heating a substrate 4 is arranged inside stainless steel chamber 1. Beneath carbon susceptor 5, a rotation device 51 for rotating substrate 4 during vapor growth is attached. A thermocouple 6 for measuring the temperature of substrate 4 is provided at the center portion of rotation device 51.

Using the vapor phase growth device thus constructed, the crystal growth of a GaInNAs-type compound semiconductor is effected according to the embodiment of the present invention, as described below.

First of all, substrate 4 is mounted on carbon susceptor 5 provided inside stainless steel chamber 1. Preferably, a GaAs substrate is used as substrate 4 so as to promote epitaxial growth. Alternatively, a Ge substrate or an Si substrate may also be used.

Next, substrate 4 is heated up to a predetermined temperature by applying a current to carbon susceptor 5.

Thereafter, a carrier gas and a source gas are introduced into stainless steel chamber 1 through quartz flow channel 2.

Hydrogen ($H_2$) gas highly purified by a hydrogen purifying device as well as nitrogen ($N_2$) gas also highly purified by a purifying device or helium (He) gas can be used as the carrier gas. The use of nitrogen ($N_2$) gas as the carrier gas improves the incorporation efficiency of N in the crystal.

Moreover, as a source gas, beside the group III source material and the group V source material, p-type or n-type dopant source gas may be used as needed. As group V source materials, the arsenic-containing group V source material including an organic group V compound gas such as tertiary-butylarsine (TBAs) or trimethylarsenic (TMAs) and the nitrogen-containing group V source material such as monomethylhydrazine (MMHy) or dimethylhydrazine (DMHy) are used. As a group III source material, triethylgallium (TEG) or tlimethylindium (TMI) is used.

The pressure inside stainless steel chamber 1 during vapor growth may be set at a reduced pressure or at atmospheric pressure. Further, the exhaust gas produced from the reaction is output from stainless chamber 1 through exhaust tube 3.

First Example

Using the vapor growth device shown in FIG. 2, the growth of a crystal of the compound semiconductor represented by $Ga_{1-x}In_x N_y As_{1-y}$ (0<x<1, 0<y<1) was effected as described below.

GaAs was used for the substrate, and the pressure in stainless steel chamber 1 was set at a reduced pressure of one-tenth atmospheric pressure. Then, a predetermined amount of triethylgallium (TEG) and a predetermined amount of trimethylindium (TMI) were supplied so that the concentration of indium (In) was x=0.1 in the crystal. Hydrogen ($H_2$) was used as the carrier gas.

When the molar supply ratio of arsenic-containing group V source material to group III source material represented by [TBAs]/([TEG]+[TMI]) was set to 1, a broad X-ray diffraction peak having the half-width of 250 arcsec was observed, exhibiting degradation in the crystalline characteristic. When, however, the molar supply ratio of arsenic-containing group V source material to group III source material represented by [TBAs]/([TEG]+[TMI]) was set to be greater than 1, the half-width was found to improve rapidly.

Then, 0.5 μm of the GaInNAs-type compound semiconductor crystal was grown at the temperature of 550° C., with the molar supply ratio of arsenic-containing group V source material to group III source material represented by [TBAs]/([TEG]+[TMI]) set at 1.8, and with the molar supply ratio of nitrogen-containing group V source material to the total group V source material represented by [DMHy]/([DMHy]+[TBAs]) set at 0.98.

Figure 3:
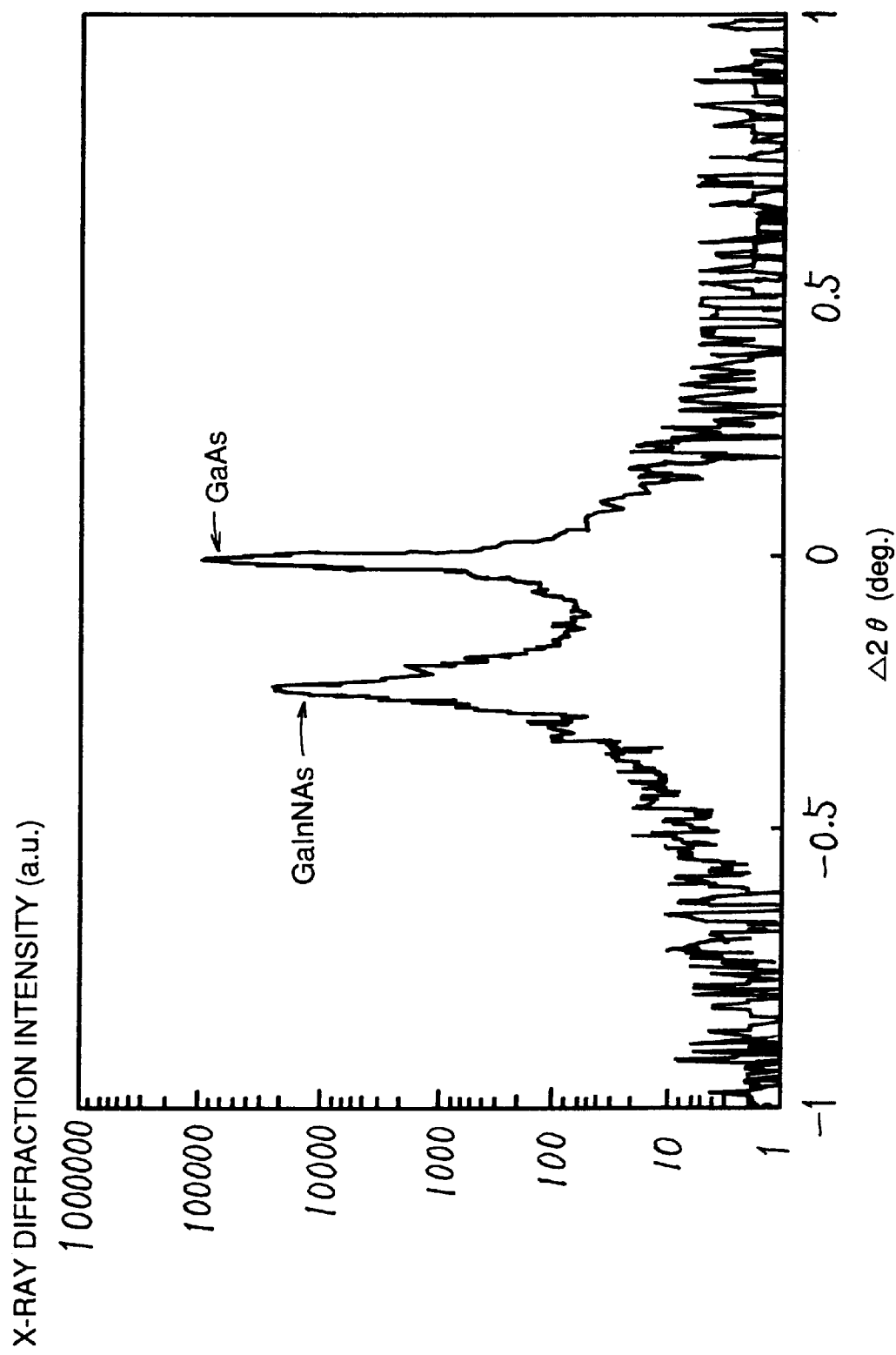
FIG. 3 is a graph illustrating a rocking curve obtained from X-ray diffraction measurement of the $Ga_{0.9}In_{0.1}NAs$ compound semiconductor crystal in the first embodiment.

FIG. 3 is a graph illustrating a rocking curve thus obtained from X-ray diffraction measurement of the GaInNAs-type compound semiconductor crystal. In FIG. 3, the horizontal axis represents δ2θ (deg.), whereas the vertical axis represents the X-ray diffraction intensity (a. u.).

As shown in FIG. 3, the peak half-width of the $Ga_{0.9}In_{0.1}NAs$ compound semiconductor crystal was found to be 30 arcsec, which implied that a favorable crystalline characteristic was obtained.

Moreover, the observation of the optical characteristic of the crystal with different molar supply ratio of arsenic-containing group V source material to group III source material represented by [TBAs]/([TEG]+[TMI]) showed that, as the molar supply ratio of arsenic-containing group V source material to group III source material became greater than 1, the half-width of photoluminescence (PL) spectrum was found to become smaller. On the other hand, when the molar supply ratio of arsenic-containing group V source material to group III source material represented by [TBAs]/([TEG]+[TMI]) was made greater than 10, the changes in the optical characteristic were no longer observed.

Next, the molar supply ratio of nitrogen-containing group V source material to the total group V source material represented by [DMHy]/([DMHy]+[TBAs]) was altered to observe the changes in the nitrogen ($N_2$) concentration within the produced crystal.

Figure 4:
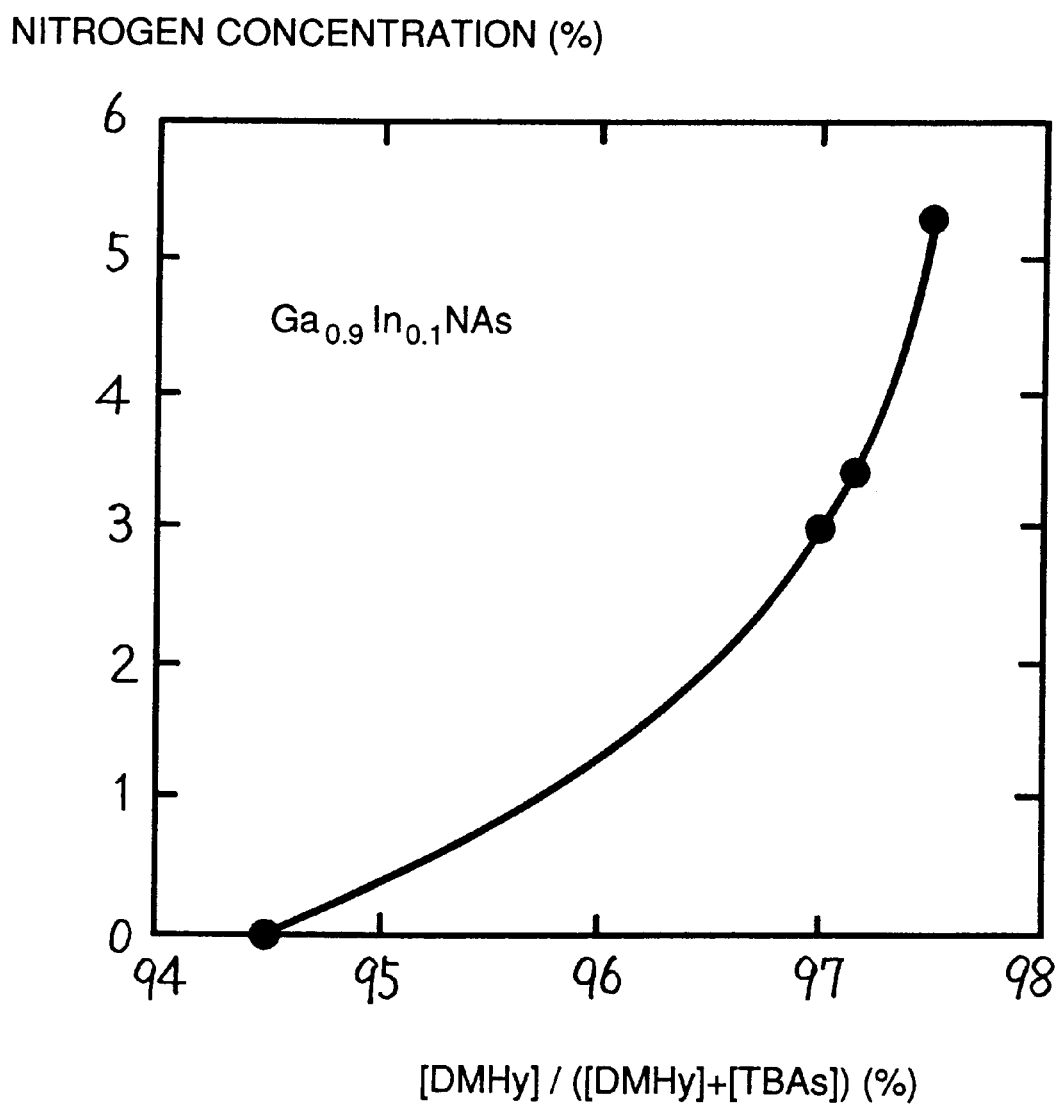
FIG. 4 is a graph showing the changes in the nitrogen concentration within the GaInNAs-type semiconductor crystal observed in relation to the changes in the molar supply ratio of the nitrogen-containing group V source material to the total group V source material.

The results are shown in FIG. 4. In FIG. 4, the horizontal axis represents the molar supply ratio of nitrogen-containing group V source material to the total group V source material, while the vertical axis represents the concentration (%) of nitrogen. The nitrogen concentration (%) was estimated using SIMS (Secondary Ion Mass Spectroscopy).

As seen from FIG. 4, by changing the molar supply ratio of nitrogen-containing group V source material to the total group V source material, the growth of a GaInNAs-type compound semiconductor crystal becomes possible while controlling the nitrogen concentration as desired.

Second Example

The growth of the compound semiconductor crystal represented by $Ga_{1-x}In_x N_y As_{1-y}$ (0<x<1, 0<y<1) was effected using GaAs for the substrate, and with the pressure inside stainless steel chamber 1 set at a reduced pressure of one-tenth atmosphere.

Here, a predetermined amount of triethylgallium (TEG) and a predetermined amount of trimethylindium (TMI) were supplied so that the concentration of indium (In) was x=0.15 in the crystal. Hydrogen ($H_2$) was used as the carrier gas. The compound semiconductor crystal represented by $Ga_{0.85}In_{0.15}N_{0.05}As_{0.95}$ and generally lattice matched to the GaAs substrate was grown at the temperature of 530° C., with the molar supply ratio of arsenic-containing group V source material to group III source material represented by [TBAs]/([TEG]+[TMI]) set at 2, and with the molar supply ratio of nitrogen-containing group V source material to the total group V source material represented by [DMHy]/([DMHy]+[TBAs]) set at 0.965.

Figure 5:
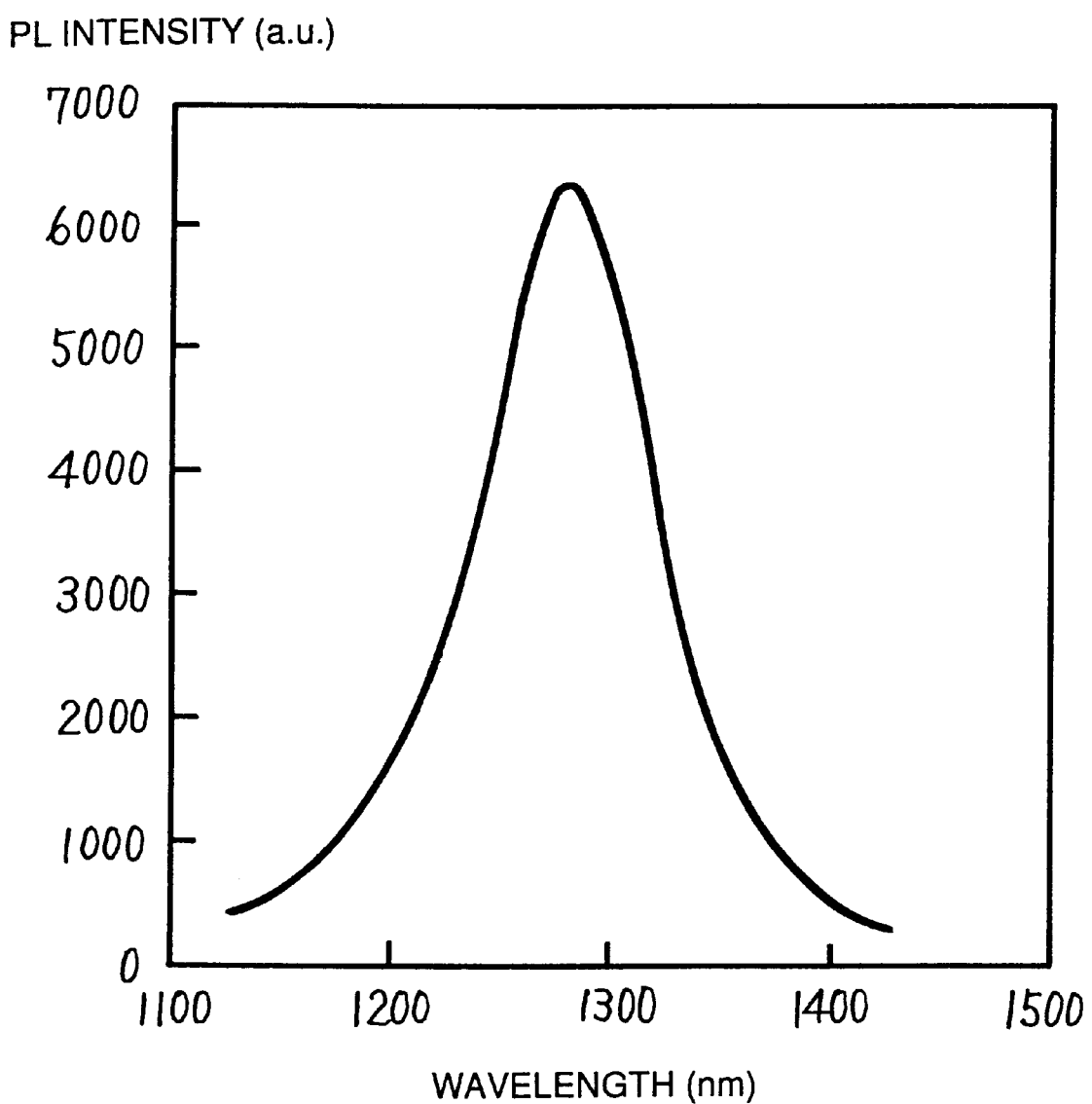
FIG. 5 is a graph showing the results of PL measurements of the $Ga_{0.85}In_{0.15}NAs$ compound semiconductor crystal at room temperature obtained in the second example.

FIG. 5 is a graph showing the results of photoluminescence (PL) measurements at room temperature of the crystal obtained. In FIG. 5, the horizontal axis represents the wavelength (nm) and the horizontal axis represents the PL light emission intensity (a. u.).

As seen from FIG. 5, light emission at the wavelength of approximately 1.3 μm was detected.

Next, taking advantage of the fact that the incorporation efficiency of N into the crystal is improved when nitrogen ($N_2$) is used as the carrier gas, the growth was effected using nitrogen ($N_2$) as the carrier gas with the growth temperature raised to 600° C. As a result, when setting the molar supply ratio of arsenic-containing group V source material to group III source material represented by [TBAs]/([TEG]+[TMI]) at 2, the compound semiconductor crystal represented by $G_{0.85}In_{0.15}N_{0.05}As_{0.95}$ and generally lattice matched to the GaAs substrate was successfully grown. The molar supply ratio of nitrogen-containing group V source material to the total group V source material represented by [DMHy]/([DMHy]+[TBAs]) in this case was 0.98.

Third Example

Next, by using trimethylarsenic (TMAs) as the arsenic-containing group V source material, the compound semiconductor crystal represented by $Ga_{1-x}In_xN_yAs_{1-y}$ (0<x<1, 0<y<1) was grown.

First, a predetermined amount of triethylgallium (TEG) and a predetermined amount of trimethylindium (TMI) were supplied so that the concentration of indium (In) was x=0.1 in the crystal. Further, the molar supply ratio of arsenic-containing group V source material to group III source material represented by [TMAs]/([TEG]+[TMI]) was set at 2, and the molar supply ratio of nitrogen-containing group V source material to the total group V source material represented by [DMHy]/([DMHy]+[TMAs]) was set at 0.98. The growth temperature was set at 550° C., and the pressure inside stainless steel chamber 1 was set at a reduced pressure of one-tenth atmospheric pressure.

The mixed crystal ratio of the crystal thus obtained was $Ga_{0.9}In_{0.1}N_{0.03}As_{0.97}$, and light emission at 1.2 μm was detected.

Fourth Example

In general, in a GaInNAs-type compound semiconductor crystal, a crystal having an excellent optical characteristic can be more easily obtained when the concentration of N within the crystal is low. Thus, the GaInNAs-type compound semiconductor crystal was grown by increasing the concentration of In instead of lowering the concentration of N, thereby producing a long-wavelength light-emitting device.

First, a predetermined amount of triethylgallium (TEG) and a predetermined amount of trimethylindium (TMI) were supplied so that the concentration of indium (In) was x=0.3 in the crystal. Hydrogen ($H_2$) was used as the carrier gas. Since a large indium (In) mixed crystal ratio within the crystal leads to the difficulty in the incorporation of N, the growth temperature was set at 500° C., and the molar supply ratio of nitrogen-containing group V source material to the total group V source material represented by [DMHy]/([DMHy]+[TBAs]) was set at 0.985 in order to raise the adsorption rate of N at the crystal growing surface. Moreover, the molar supply ratio of arsenic-containing group V source material to group III source material represented by [TBAs]/([TEG]+[TMI]) was set at 2, and the pressure inside stainless steel chamber 1 was set at one-tenth atmosphere.

Figure 6:
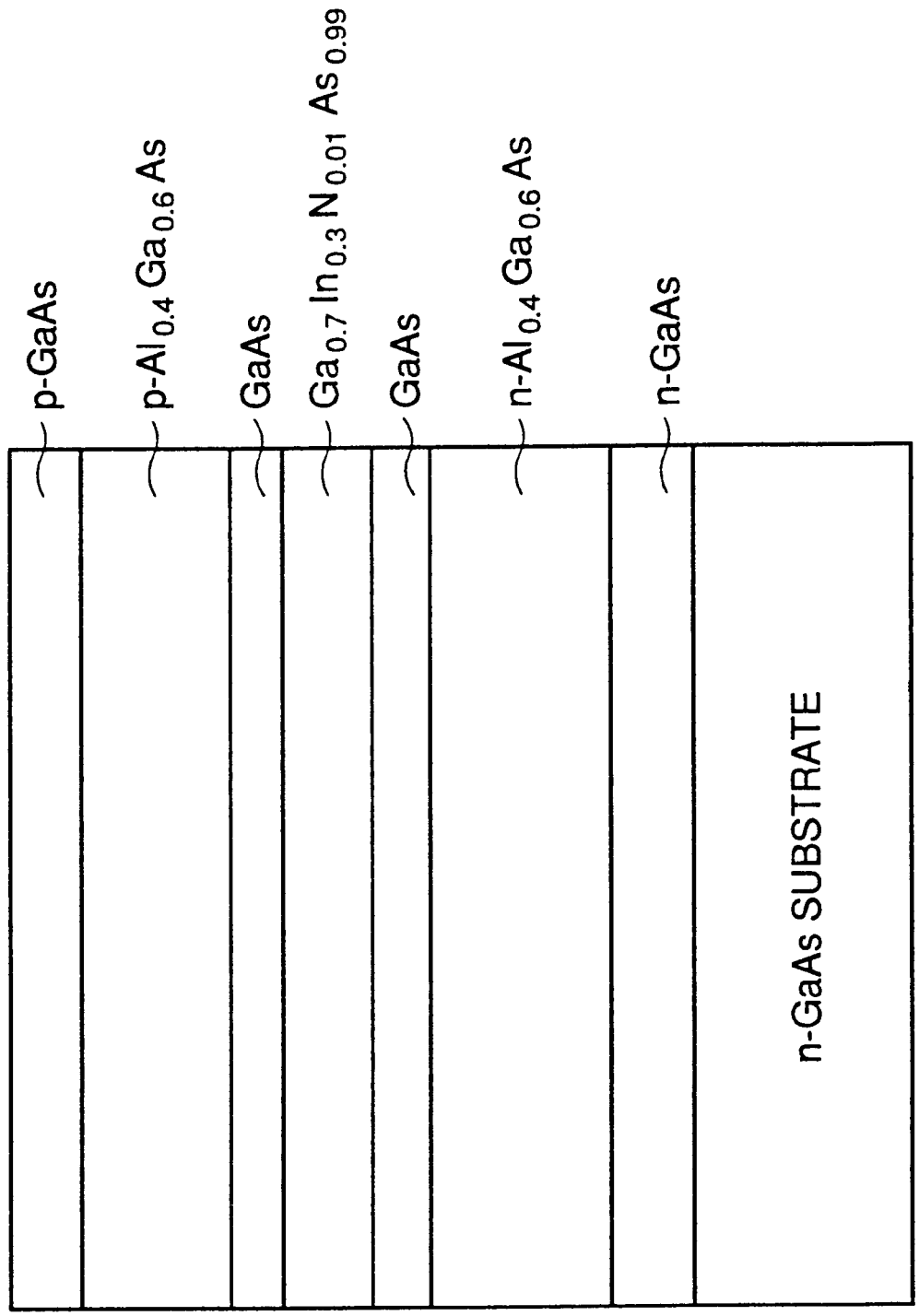
FIG. 6 is a cross sectional view illustrating the configuration of a quantum well structure obtained in the fourth example.

In this manner, the quantum well structure as shown in FIG. 6 was formed. First, on an n-type GaAs substrate, an n-type GaAs buffer layer was grown at the temperature of 600° C. to a thickness of 0.3 μm, and thereafter, a 1.5 μm thick n-type $Al_{0.4}Ga_{0.6}As$ barrier layer was grown. Here, tetraethylsilane (TeESi) was used as the n-type dopant source material. Then, the growth temperature was lowered to 500° C. during the growth of a 0.15 μm undoped GaAs spacer layer, and the compound semiconductor crystal represented by $Ga_{0.7}In_{0.3}N_{0.01}As_{0.99}$ having a thickness of 60 Å was grown as a well layer. Further, the growth temperature was raised back to 600° C. during the growth of a 0.15 μm thick undoped GaAs spacer layer, and a p-type $Al_{0.4}Ga_{0.6}As$ barrier layer and a 0.2 μm thick p-type GaAs contact layer were grown. Diethylzinc (DEZn) was used as the p-type dopant source material.

In the semiconductor multi-layer film having the quantum well structure thus obtained, a p-type electrode was formed on the p-type GaAs contact layer and an n-type electrode was formed on the backside of the n-type GaAs substrate, thereby forming a long-wavelength light-emitting device.

In this long-wavelength light-emitting device, the GaInNAs-type compound semiconductor crystal forming the well layer is distorted without being lattice matched to the substrate. Since, however, the well layer has a thickness thinner than the critical film thickness, a crystal with little dislocation can be grown, permitting the formation of a long-wavelength light-emitting device.

In accordance with the present invention according to the first embodiment, the use of an organic group V compound gas as the arsenic-containing group V source material for the growth of a GaInNAs-type compound semiconductor allows a more favorable crystal growth at a lower supply ratio of arsenic-containing group V source material in comparison with the conventional case in which arsine ($AsH_3$) is used. Therefore, the amount of waste that contains poisonous arsenic (As) may be reduced, thereby effectively preventing environmental pollution.

Second embodiment

Figure 7:
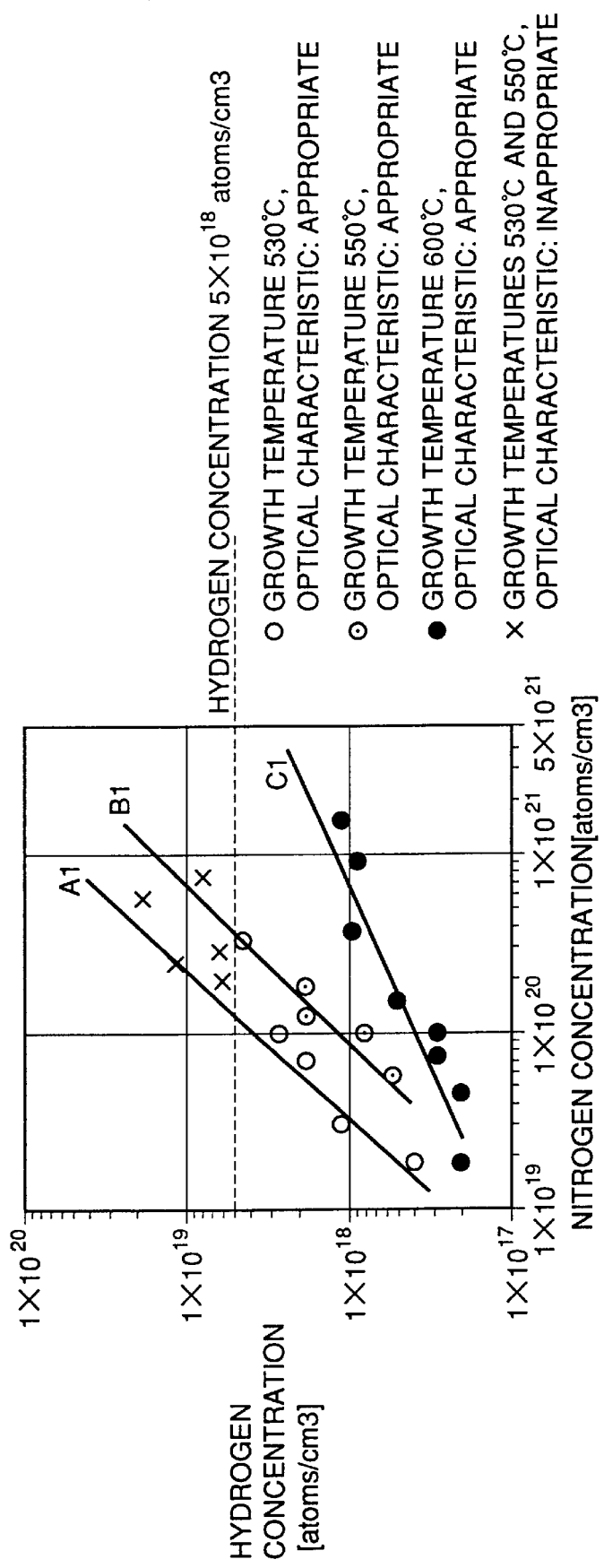
FIG. 7 is a graph showing the correlation between the hydrogen concentration and the optical characteristic of the GaNAs thin film crystal.
Figure 8:
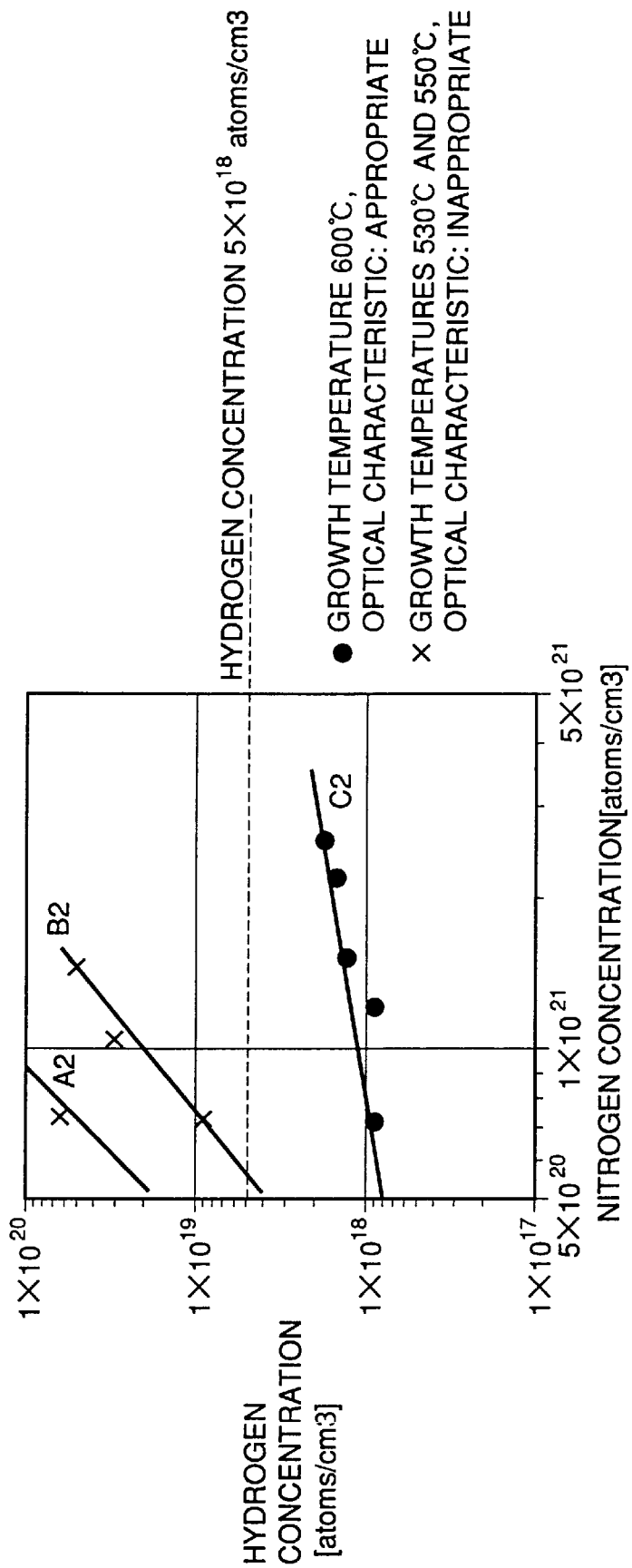
FIG. 8 is a graph showing the correlation between the hydrogen concentration and the optical characteristic of the GaInNAs thin film crystal.

FIGS. 7 and 8 are graphs of correlations between the hydrogen concentration and the optical characteristic of the produced $Ga_{1-x}In_x N_yAs_{1-y}$ and $GaN_yAs_{1-y}$ thin film crystals for comparison.

FIG. 7 is directed to GaNAs, whereas FIG. 8 is directed to $Ga_{0.9}In_{0.1}N_yAs_{1-y}$. The graphs respectively show the relations between the concentrations of hydrogen and nitrogen as well as their respective optical characteristics. In the graphs, a circle indicates the sample having a luminescence intensity sufficient for practical use, and a cross indicates the sample having a low luminescence intensity and thus insufficient for practical use. As a point of reference, the crystal intensity of 1/20 or more in comparison with the luminescence intensity of a $Ga_{0.25}In_{0.75}AsS_{0.54}P_{0.46}$ crystal grown on an InP substrate utilized for a laser diode at present was chosen. The concentrations of hydrogen and nitrogen were measured by secondary ion-mass spectroscopy (SIMS). In the present specification, the intensity of GaInAsP taken as a comparative example was set at 20, and the luminescence intensities of $Ga_{1-x}In_x N_yAs_{1-y}$ and $GaN_yAs_{1-y}$ thin film crystals are represented accordingly. Thus, the luminescence intensity of 1 or more is considered to be sufficient for practical use.

In FIGS. 7 and 8, lines A1, A2, B1, B2, C1, C2 respectively represent the relations between the nitrogen concentration and the hydrogen concentration in the cases of growths at 530° C., 550° C., and 600° C. The tendency of the concentration of hydrogen rising corresponding to the rise in the concentration of nitrogen was noted. As seen from these drawings, there is a need to keep the hydrogen concentration at $5 \times 10^{18}$ atoms/$cm^3$ or below in order to obtain from the thin film crystal a luminescence intensity sufficient for practical use.

The bond condition of hydrogen present within the $Ga_{1-x}In_x N_yAs_{1-y}$ or $GaN_yAs_{1-y}$ thin film crystal having an unfavorable luminescence characteristic was measured by Fourier transform infrared spectroscopy (FT-IR). As an example, the case of a sample produced by growing a 0.5 μm thick $GaN_{0.012}As_{0.988}$ crystal on a GaAs substrate is described below. The hydrogen concentration in this case was $1.5 \times 10^{19}$ atoms/$cm^3$. It is to be noted that the example of measurement of the GaNAs having the above-described composition is only one of the several measurements conducted.

A clearly defined absorption peak was observed in the location with a wave number of 2950 $cm^{-1}$. This peak is only observed when the nitrogen and the hydrogen within the crystal are in an atomic bonding condition (i.e. when N-H bonds are present).

The sample was heat treated in a nitrogen atmosphere at temperatures of 500° C., 550° C., 600° C., 700° C., and 800° C., and the changes in the absorption peak and the luminescence intensity were measured accordingly. The results are shown in FIG. 9.

Figure 9:
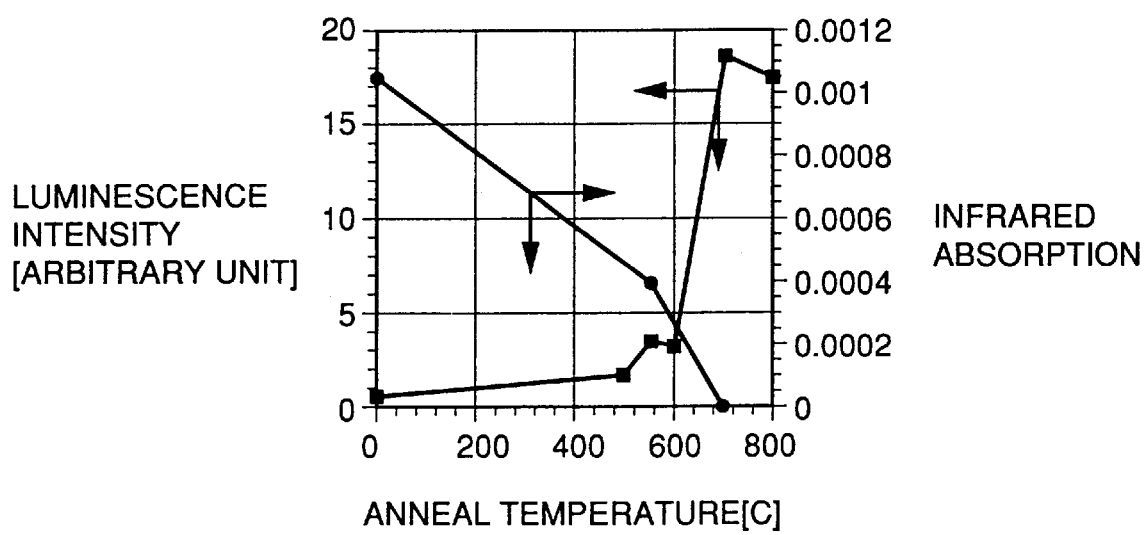
FIG. 9 is a graph showing the results of measured changes in the absorption peak and the luminescence intensity obtained when subjected to heat treatments performed under various nitrogen atmospheres.

As seen from FIG. 9, as the temperature rises, the absorption peak becomes smaller in comparison with the case without heat treatments. With the heat treatment at 700° C., the absorption peak is no longer observed. It is appreciated that a sufficient luminescence intensity is obtained. In other words, even with the hydrogen concentration being higher than $5 \times 10^{18}$ atoms/$cm^3$, the atomic bonds between nitrogen and hydrogen (or the N-H bonds) in the crystal can be broken by heat treatment performed at a temperature in the range of 500 to 800° C., resulting in a luminescence intensity sufficient for practical use. Preferably, the gas atmosphere is a non-oxidizing atmosphere such as that of hydrogen, nitrogen, argon, or helium, an arsenic-type gas atmosphere such as that of arsine, a phosphorus-type gas atmosphere such as that of phosphine, or vacuum. The gas ambient may be a mixture of the above gases. The duration of heat treatment is preferably from 10 seconds to 24 hours. If the uppermost layer of the compound semiconductor device is a semiconductor containing arsenic such as GaAs, AlGaAs, InGaAs or the like, it is desirable to perform heat treatment in an arsenic-type gas such as arsine, tertiary-butylarsine, or the like in order to prevent the desorption of arsenic from the surface. Similarly, if the uppermost layer is a semiconductor containing phosphorus such as GaInP, AlGaInP, AlInP, InGaAsP or the like, it is desirable to perform heat treatment in a phosphorus-type gas such as phosphine, tertiary-butylphosphine, or the like in order to prevent the desorption of phosphorus from the surface.

It was discovered from SIMS analyses conducted after heat treatment that, although it was possible to break the bond between hydrogen and nitrogen, the concentration of hydrogen could not be reduced. As a consequence, the high concentration hydrogen within the crystal recouples with nitrogen, thereby degrading the optical and electrical characteristic once again. By effecting the heat treatment at a temperature from 800° C. to 1100° C., the bond between hydrogen and nitrogen in the $Ga_{1-x}In_x N_yAs_{1-y}$ or $GaN_yAs_{1-y}$ thin film crystal can be broken, and hydrogen can be removed from the crystal. Thus, a highly reliable device may be produced. Preferably, the gas ambient is a non-oxidizing atmosphere such as that of hydrogen, nitrogen, argon, or helium, an arsenic-type gas atmosphere such as that of arsine, a phosphorus-type gas atmosphere such as that of phosphine, or vacuum. The gas atmosphere may be a mixture of the above gases. The heat treatment is carried out preferably for 10 seconds to 24 hours.

Heat treatment may be performed by reheating the multi-layer structure after growing it inside the growth furnace and cooling it down to room temperature. Alternatively, heat treatment may be performed directly after the growth of the multi-layer structure inside the growth furnace. By performing heat treatment inside the growth furnace, a highly reliable semiconductor device may be effectively and inexpensively formed.

In addition, since $Ga_{1-x}In_x N_yAs_{1-y}$ and $GaN_yAs_{1-y}$ are compound crystal semiconductors composed of elements having atomic radii which vary greatly from one another, it is extremely difficult to obtain a crystal of a uniform composition.

The atomic radii of group III elements and group V elements are shown in Table 5.

TABLE 5

Comparison of atomic radii

| Group III Element | Atomic Radius (Å) | Group V Element | Atomic Radius (Å) |
|---|---|---|---|
| Al | 1.230 | N | 0.719 |
| Ga | 1.225 | P | 1.128 |
| In | 1.405 | As | 1.225 |

As shown in Table 5, the atomic radii of other group III elements and group V elements vary greatly from the atomic radius of nitrogen. The atomic radius of indium is approximately twice that of nitrogen. When growing a mixed crystal semiconductor from atoms having a different atomic radius, partial distortion occurs. It is therefore difficult to form a good quality crystal. This is a problem originating in the combination of the material being used. In other words, it is a problem inherent in the nitride material of the present invention. Even with the hydrogen concentration of $5 \times 10^{18}$ atoms/cm$^3$ or below, heat treatment at a temperature of 500° C. to 1100° C. improves the crystalline characteristic, making it possible to form a device having a favorable characteristic.

According to the compound semiconductor device in accordance with the second embodiment, the optical device or the electronic device sufficient for practical use having a $Ga_{1-x}In_xN_yAs_{1-y}$ or $GaN_yAs_{1-y}$ crystal of high optical and electrical characteristics containing only a small amount of hydrogen impurity is obtained. Here, the concentration of hydrogen impurity sufficient for practical use is $5 \times 10^{18}$ atoms/cm$^3$ or below.

Further, an optical device having favorable electrical and optical characteristics may be obtained by the heat treatment which breaks the nitrogen-hydrogen bonds or by the heat treatment which decreases the nitrogen concentration that permits the improvement in the quality of the crystal even with a large amount of hydrogen impurity being present.

Moreover, a favorable crystal may be obtained, even with a small amount of hydrogen impurity being present, by heat treatment which solves the inherent problems of a nitride crystal.

Furthermore, by performing heat treatment directly after the crystal growth, the mass-production of the device becomes possible while the time and energy involved in the crystal growth are advantageously reduced.

Fifth Example

A quartz horizontal reaction furnace and a semi-insulating GaAs (001) substrate was used for the growth. Triethylgallium (TEG) or trimethylindium (TMI) was used as the group III Ga or In source material, respectively. Dimethylhydrazine (DMHy), tertiary-butylarsine (TBAs), or tertiary-butylphosphine (TBP) was used as the group V N, As, or P source material. Hydrogen was used as the carrier gas. The pressure inside the growth furnace was set at 76 Torr. The growth temperature was varied at three levels: 530° C., 550° C., and 600° C.

A $Ga_{0.9}In_{0.1}N_{0.035}As_{0.965}$ crystal lattice matched on the GaAs (001) substrate was obtained with the following conditions. By fixing the [TBAs]/([TEG]+[TMI]) molar supply ratio at 1.8, at growth temperatures of 530° C., 550° C., and 600° C., and by setting the [DMHy]/([DMHy]+[TBAs]) molar supply ratio at 0.98, 0.982, and 0.985 respectively, the crystal was lattice matched on the GaAs (001) substrate. In addition, the nitrogen concentration was controlled by increasing or decreasing the above molar supply ratio at each growth temperature.

A $Ga_{0.85}In_{0.15}N_{0.053}As_{0.947}$ crystal having a higher In concentration and lattice matched on the GaAs (001) substrate was obtained with the fixed [TBAs]/([TEG]+[TMI]) molar supply ratio of 2 at growth temperatures of 530° C. and 600° C. and by setting the [DMHy]/([DMHy]+[TBAs]) molar supply ratio at 0.984 for 530° C. and 0.987 for 600° C., respectively. The results are not shown in FIGS. 7, 8, 11 and 12.

Next, the method of growing a GaNAs crystal will be described below. The [TBAs]/[TEG] molar supply ratio was fixed at 5, and the [DMHy]/([DMHy]+[TBAs]) molar supply ratio was varied in the range of 0.256 to 0.9 corresponding to the concentration of nitrogen. The three levels of growth temperatures, 530° C., 550° C., and 600° C., were used.

Figure 10A:
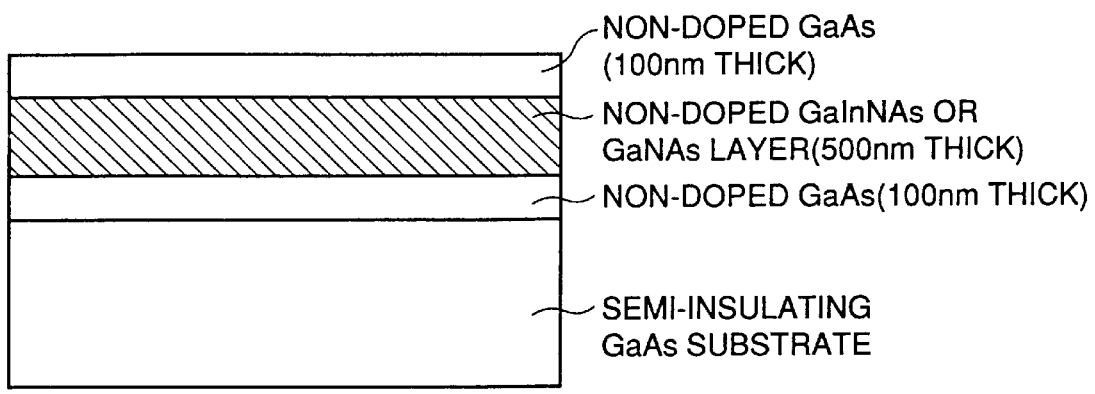
FIG. 10A is a cross sectional view of a semiconductor device having a double-hetero structure for evaluating the optical characteristic.
Figure 10B:
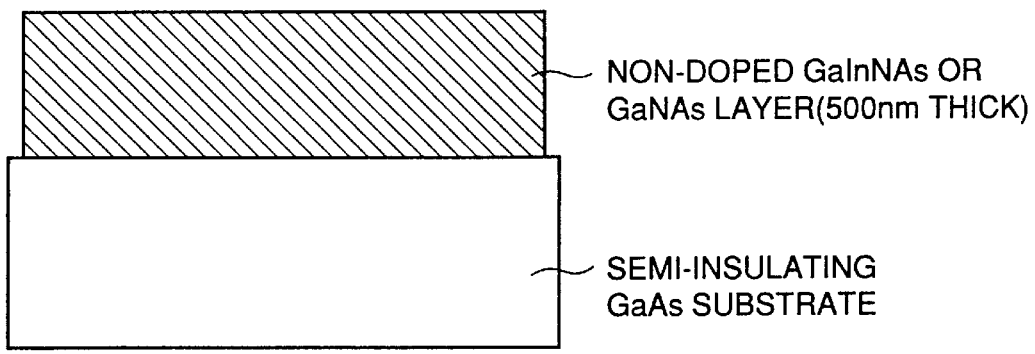
FIG. 10B is a cross sectional view of a semiconductor device having a single-layer structure for evaluating the electrical characteristic.

The actual device structures formed are shown in FIGS. 10A and 10B. FIG. 10A is a diagram showing the double-hetero structure for evaluating the optical characteristic, and FIG. 10B is a diagram showing the single-layer structure for evaluating the electrical characteristic.

Figure 1A:
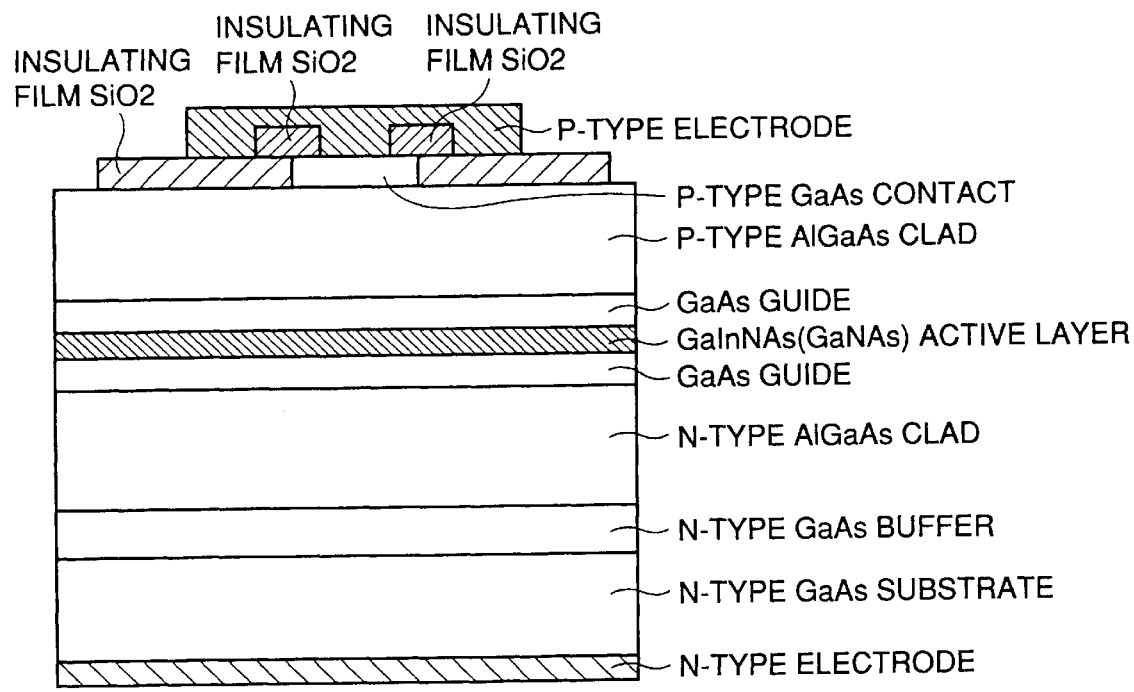
FIG. 1A and FIG. 1B are cross sectional views of a conventional semiconductor laser and a conventional light-receiving diode which utilize $Ga_{0.85}In_{0.15}N_{0.05}As_{0.95}$.
Figure 1B:
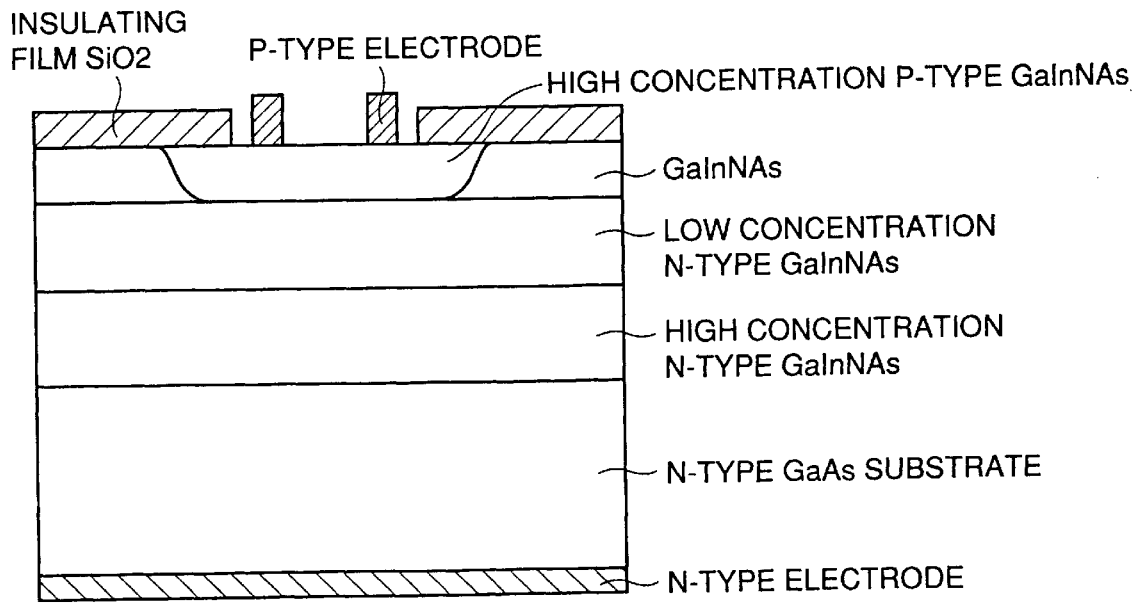

For the measurement of the optical characteristic, the double-hetero structure (DH structure), which is a simplified form of a semiconductor laser structure, shown in FIG. 10A consisting of a GaInNAs or GaNAs thin film crystal sandwiched by GaAs layers was used. With this structure, the changes in the optical characteristic were observed by measuring the intensity of luminescence. A simplified structure was used because, with the actual laser structure as the one shown in FIG. 1, the layers which sandwich the crystal and are made of different material species from that of the crystal will scatter and absorb the luminescence from the GaInNAs or GaNAs crystal, which makes it impossible for accurate measurements to be performed.

The thickness of the GaInNAs or GaNAs layer was made to be 500 nm, while the GaAs layers above and below the GaInNAs or GaNAs layer was made to be 100 nm thick. Moreover, for the measurement of the electrical characteristic, the GaInNAs or GaNAs thin film crystal single layer shown in FIG. 10B, which is a simplified form of a light-receiving diode, was used. The simplified form was used because, with the actual structure in which a p-type layer and an n-type layer form a junction, the changes in the characteristic of other layers would be measured as well. For the measurement, the so-called hole measuring method was used at room temperature. The thickness of the GaInNAs or GaNAs layer was made to be 500 nm.

The luminescence intensity of the produced sample was measured by directing light having a wavelength of 514 nm generated by an argon laser, and thereby evaluating the intensity of luminescence emitted from the crystal by means of a detector made of germanium. For the SIMS analysis of the impurity concentration, cesium ions were implanted into the sample, and the sputtered hydrogen negative ions (H⁻) were detected. The absolute temperature was calculated by making a comparison with the As ions detected at the same time. The correction of the measurement system was carefully performed using the correction sample which was made by implanting N ions produced separately into the GaAs thin film.

As seen from FIGS. 7 and 8 described with reference to the second embodiment, when the growth was effected at 600° C. with GaNAs, the nitrogen concentration was varied in the range of $1.8 \times 10^{19}$ to $1.5 \times 10^{21}$, while the hydrogen concentration showed a low concentration in the range of $2.9 \times 10^{17}$ to $1.1 \times 10^{18}$. The intensity for InGaAsP being 20, the luminescence intensity of GaNAs was 2.3 to 2.6, which implies that the luminescence intensity sufficient for practical use was obtained at all nitrogen concentration levels.

On the other hand, at 530° C., there is a strong correlation between the concentration of hydrogen and the luminescence intensity. With a low concentration of nitrogen in the range of $1.8 \times 10^{19}$ to $1.0 \times 10^{20}$, the -hydrogen concentration was in the range of $3.8 \times 10^{17}$ to $2.7 \times 10^{18}$, and the luminescence intensity was in the range of 1.8 to 14. With a high concentration of nitrogen in the range of $1.9 \times 10^{20}$ to $5.5 \times 10^{20}$, however, the hydrogen concentration was in the range of $5.9 \times 10^{18}$ to $1.9 \times 10^{19}$, and the luminescence intensity was in the low range of 0.09 to 0.87, which is insufficient for practical use.

When GaInNAs is grown with the composition of $Ga_{0.9}In_{0.1}N_{0.035}As_{0.965}$, at the growth temperatures of 530° C., 550° C. and 600° C. and with the nitrogen concentration of $7.2 \times 10^{20}$, the respective concentrations of hydrogen are $6.2 \times 10^{19}$, $8.9 \times 10^{18}$, and $8.2 \times 10^{17}$, and their respective luminescence intensity are 0 (below detection limit), 0, and 2.4. Thus, the luminescence intensity sufficient for practical use is only obtained at a hydrogen concentration of $5 \times 10^{18}$ or below.

Sixth Example

Using the growth method described with reference to the first example, at the temperature of 530° C., the concentration of hydrogen within the crystals for either the cases of $Ga_{1-x}In_xN_yAs_{1-y}$ or $GaN_yAs_{1-y}$ becomes $5 \times 10^{18}$ atoms/cm$^3$ or more (see FIGS. 7 and 8).

After growing the structure described in the fifth example under these conditions, the structure was reheated under the following conditions. Thereafter, the optical and electrical characteristics were measured.

In this heat treatment, an SiN film was grown to the thickness of 100 nm by plasma CVD (Chemical Vapor Deposition) to prevent the evaporation of As from the surface. The SiN film was removed by a 5% hydrofluoric acid after the heat treatment.

The above structure was heat treated in a hydrogen atmosphere at 76 Torr. A quartz heating furnace was used for the heat treatment. The example in which a $GaN_{0.012}As_{0.988}$ sample was heat treated will be described below. Ten levels of heat treatment temperature used in the examples were 300° C., 500° C., 600° C., 650° C., 700° C., 750° C., 800° C., 850° C., 900° C., and 1100° C. The temperature is raised at the rate of 80° C. per minute from room temperature up to the maximum temperature to be reached. After reaching the heat treatment temperature, the temperature is maintained for 10 minutes. Then, the temperature is allowed to decline to room temperature at the rate of 80° C. per minute.

Table 6 shows the intensity of luminescence in relation to the heat treatment temperature.

TABLE 6

Relation between hydrogen composition and luminescence intensity with respect to heat treatment temperature of $GaN_{0.012}As_{0.988}$ grown at 530° C. (measured at room temperature)

| Heat Treatment Temperature | Luminescence Intensity (Arbitrary Unit) | Hydrogen Concentration (atom/cm$^3$) |
|---|---|---|
| not heat treated | 0.52 | $1.2 \times 10^{19}$ |
| 300° C. | 0.89 | $1.3 \times 10^{19}$ |
| 500° C. | 1.62 | $1.2 \times 10^{19}$ |
| 600° C. | 8.53 | $1.2 \times 10^{19}$ |
| 650° C. | 13.27 | $1.1 \times 10^{19}$ |
| 700° C. | 18.7 | $1.2 \times 10^{19}$ |
| 750° C. | 18.3 | $1.0 \times 10^{19}$ |
| 800° C. | 17.3 | $9.2 \times 10^{18}$ |
| 850° C. | 17.0 | $1.2 \times 10^{18}$ |

TABLE 6-continued

Relation between hydrogen composition and luminescence intensity with respect to heat treatment temperature of $GaN_{0.012}As_{0.988}$ grown at 530° C. (measured at room temperature)

| Heat Treatment Temperature | Luminescence Intensity (Arbitrary Unit) | Hydrogen Concentration (atom/cm$^3$) |
|---|---|---|
| 900° C. | 16.8 | $2.0 \times 10^{17}$ |
| 1100° C. | 15.2 | $2.1 \times 10^{17}$ |

In comparison with the case of no treatment, from the luminescence intensity improves as the heat treatment temperature increases from 300° C. or above to 700° C. or below. Although the luminescence intensity decreases at a temperature above 700° C., the intensity is still higher than in the case of no treatment.

As described with reference to the embodiments, FIG. 9 shows the changes in the luminescence intensity and the hydrogen-nitrogen bonds within the sample. With the heat treatment of 700° C., it is seen that the hydrogen-nitrogen bonds are completely broken, and the luminescence intensity sufficient for practical use is obtained. As seen from Table 6, the hydrogen concentration is not lowered through the heat treatment of 700° C., but requires a heat treatment temperature of 800° C. or above.

Next, the two samples of GaNAs and GaInNAs were heat treated at 700° C., at which the luminescence intensity was the highest in the above experiment. The duration of heat treatment was varied from 10 seconds to 2 hours.

The results are shown in Table 7.

TABLE 7

Relation between luminescence intensity with respect to heat treatment duration at 700° C. of $GaN_{0.012}As_{0.988}$ and $Ga_{0.9}In_{0.1}N_{0.035}As_{0.965}$ grown at 530° C. (measured at room temperature)

| Duration | GaNAs Luminescence Intensity (Arbitrary Unit) | GaInNAs Luminescence Intensity (Arbitrary Unit) |
|---|---|---|
| not heat treated | 0.52 | 0 |
| 10 seconds | 17.2 | 18.1 |
| 30 seconds | 17.8 | 18.7 |
| 1 minute | 18.1 | 19.1 |
| 10 minutes | 18.7 | 19.3 |
| 120 minutes | 18.9 | 19.5 |

Here, the same sample was repeatedly heat treated. The duration of heat treatment represented on the horizontal axis is the cumulative time at the temperature to be reached. A rapid thermal annealing (RTA) device, which allows rapid heating, was used. The heat treatment was performed in a nitrogen atmosphere at 760 Torr.

As seen from Table 7, a luminescence intensity sufficient for practical use was obtained after 10 seconds of heat treatment. It was found that as the time for heat treatment was increased, the luminescence intensity also increased.

Figure 11:
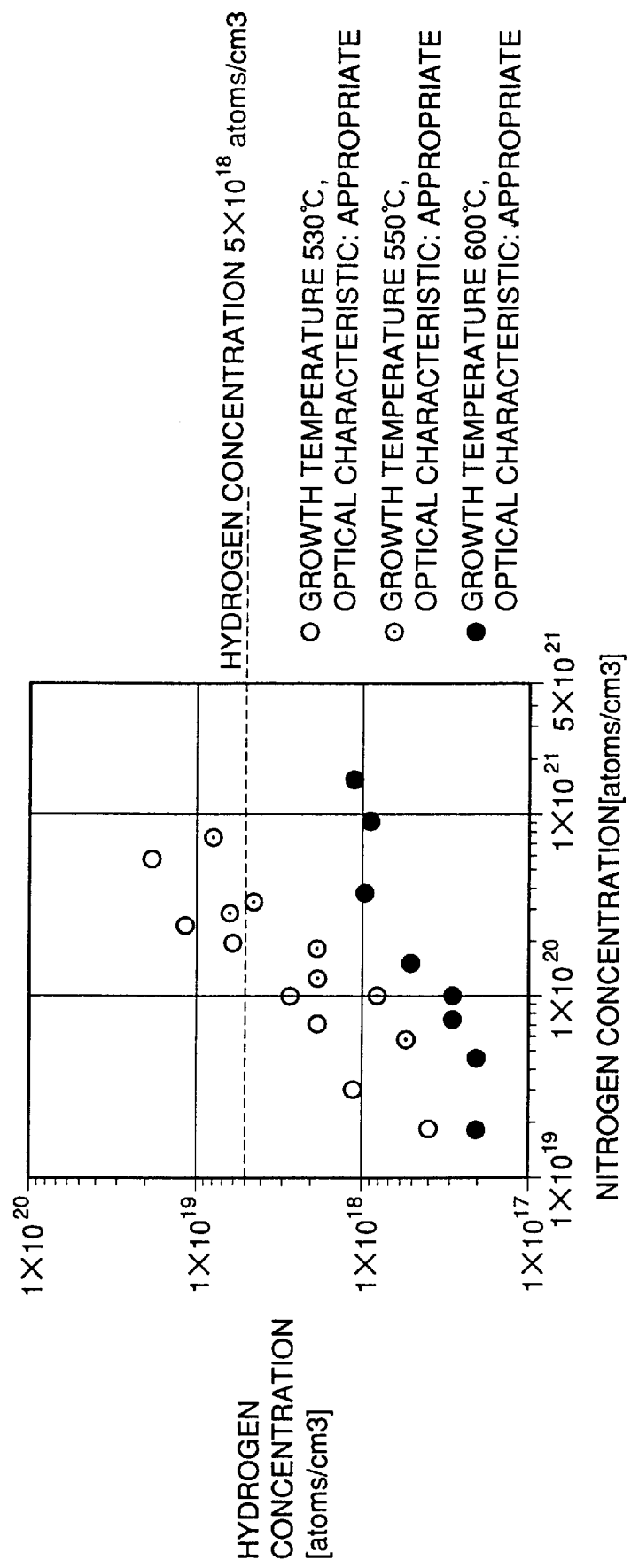
FIG. 11 is a graph of the optical characteristic of GaNAs after heat treatment representing the relation between the concentrations of nitrogen and hydrogen.
Figure 12:
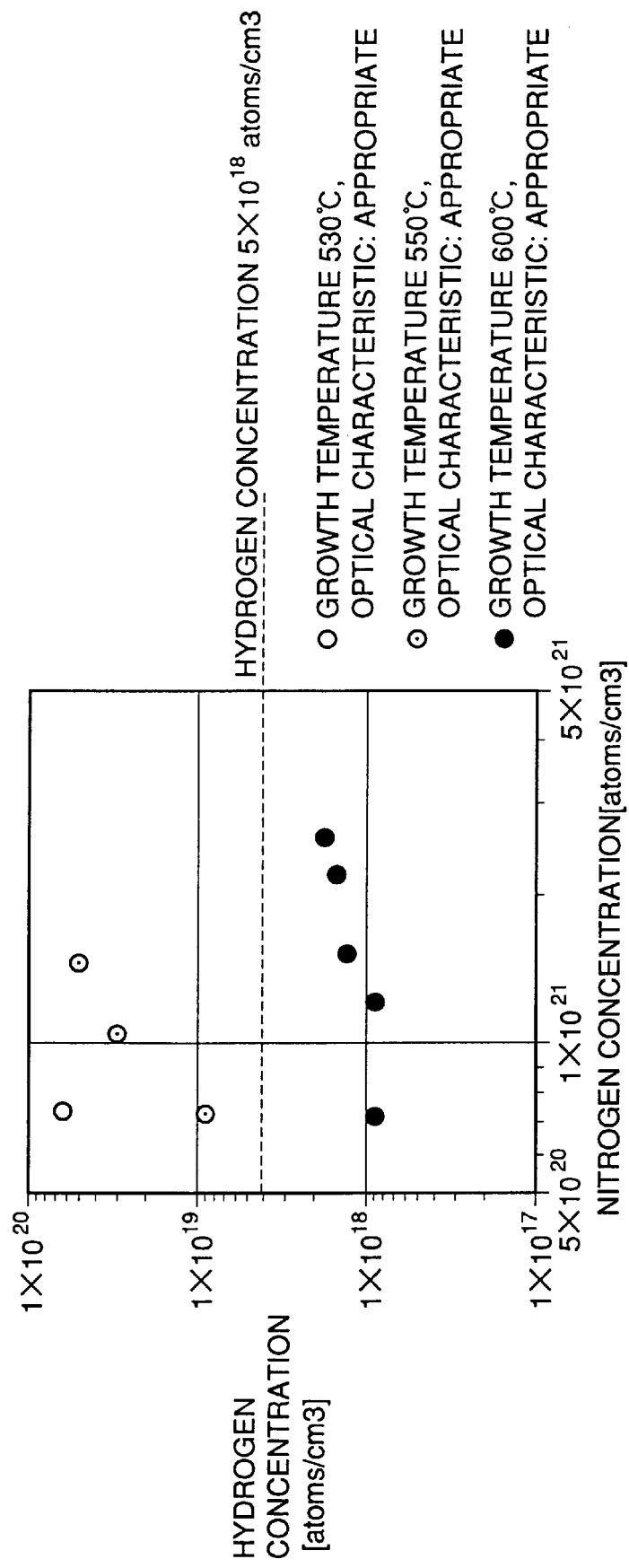
FIG. 12 is a graph of the optical characteristic of GaInNAs after heat treatment representing the relation between the concentrations of nitrogen and hydrogen.

Those samples whose luminescence intensities were evaluated as insufficient for practical use by the relation between the luminescence intensity and the nitrogen concentration described in relation to FIGS. 7 and 8 were heat treated at 700° C. As a result, as shown in FIGS. 11 (GaNAs) and 12 (GaInNAs), their respective luminescence intensities were improved, resulting in a characteristic sufficient for practical use.

Table 8 shows the changes in the specific resistance in relation to the heat treatment temperature.

TABLE 8

Changes in specific resistance with regard to heat treatment temperature of $Ga_{0.9}In_{0.1}N_{0.035}As_{0.965}$ grown at 530° C. (measured at room temperature)

| Heat Treatment Temperature | Specific Resistance (Ωcm) |
|---|---|
| not heat treated | (*) |
| 300° C. | (*) |
| 500° C. | 19.8 |
| 600° C. | 10.7 |
| 700° C. | 8.1 |
| 800° C. | 7.9 |
| 900° C. | 7.9 |
| 1000° C. | 8.1 |
| 1100° C. | 8.2 |

(*) indicates that specific resistance is larger than 400 Ωcm, which cannot be measured.

The measured sample was $Ga_{0.9}In_{0.1}N_{0.035}As_{0.965}$. From 300° C. to 800° C., the specific resistance decreased as the temperature to be reached was raised. In the temperature range of above 800° C. and below 1100° C., the specific resistance became generally constant as the temperature increased.

Seventh Example

This example relates to heat treatment within a growth furnace.

Using the growth method described with reference to the fifth example, at the growth temperature of 530° C. as in the sixth example, the $GaN_{0.012}As_{0.988}$ and $Ga_{0.9}In_{0.1}N_{0.035}As_{0.965}$ DH structures were grown. A sufficient luminescence characteristic is not obtained without heat treatment. Thus, heat treatment was performed after the growth of the DH structures without lowering the temperature.

Figure 13:
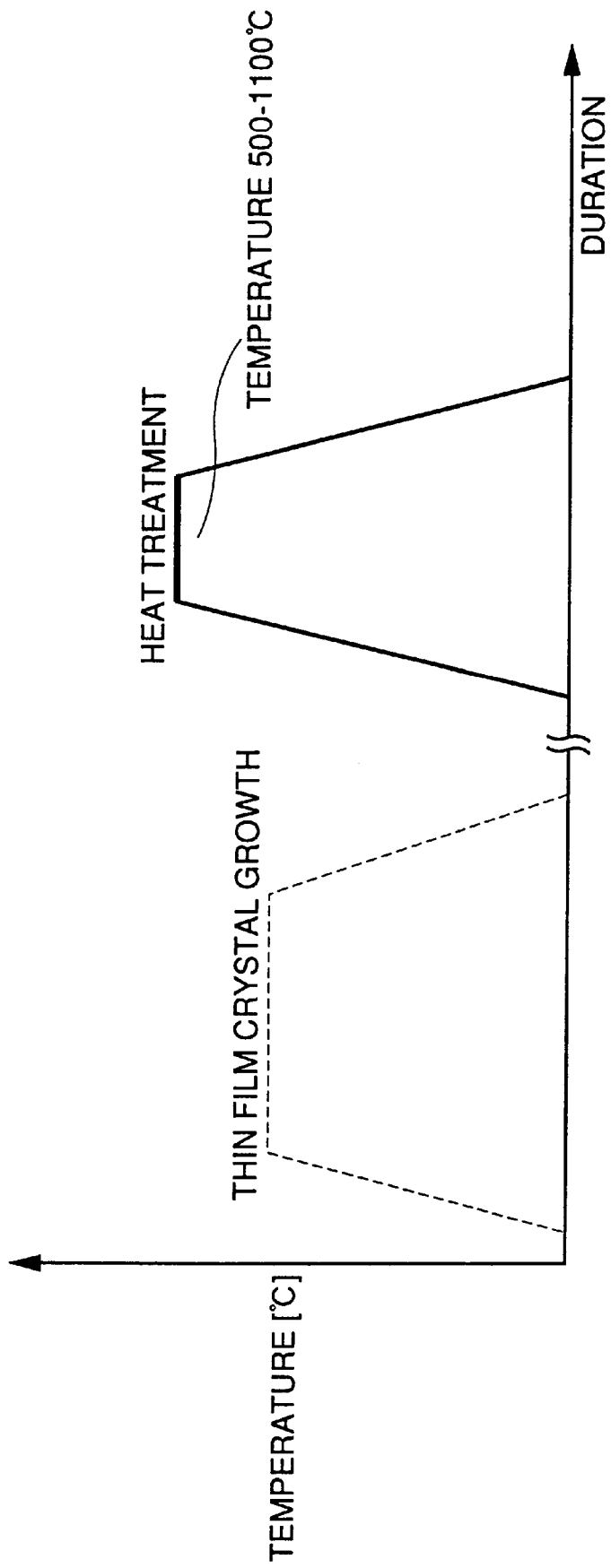
FIG. 13 is a graph showing the temperature profile of the device structure subjected to reheating after the growth.

FIG. 13 shows the temperature profile of the device structure subjected to reheating after the growth.

Figure 14:
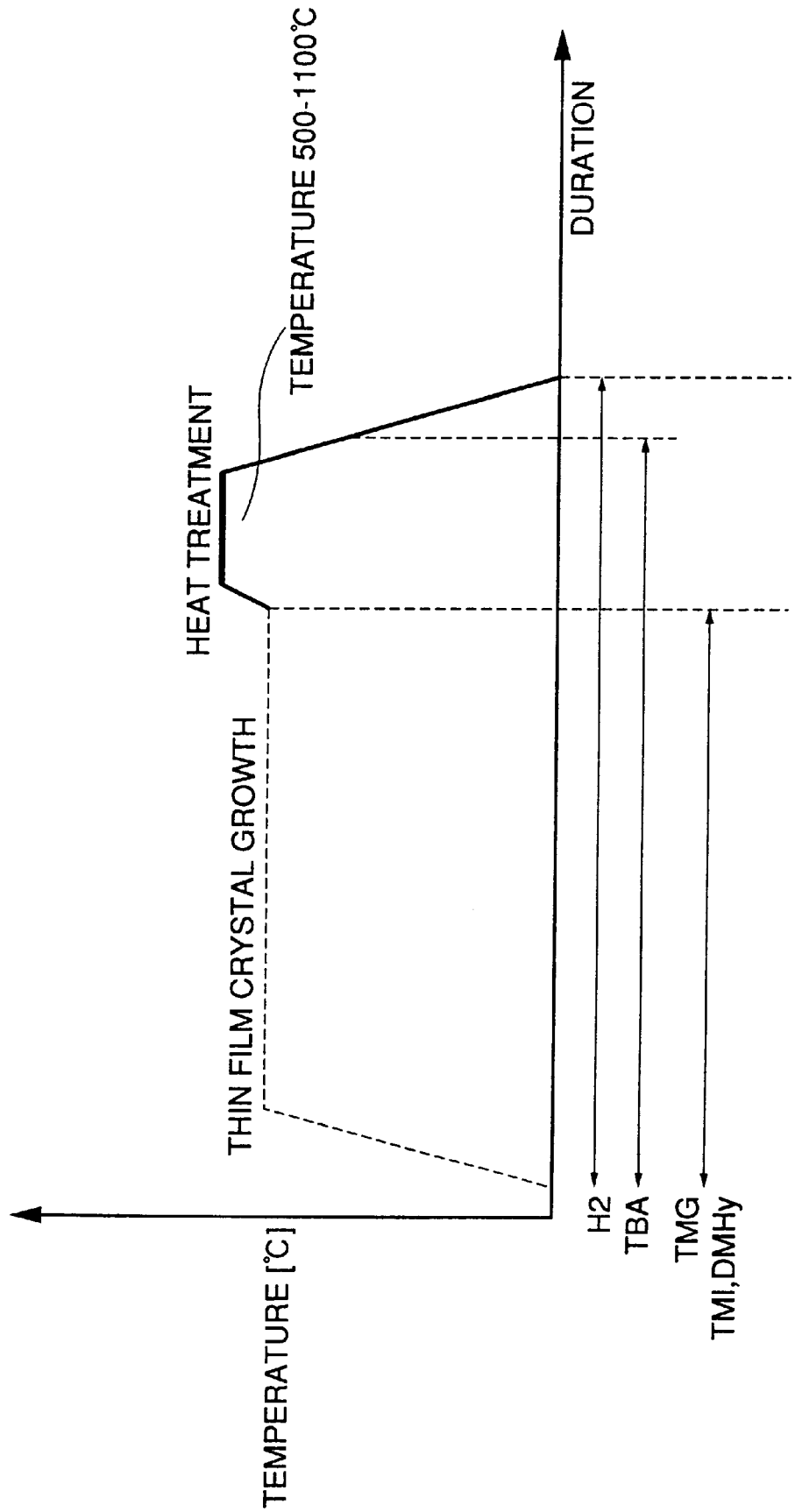
FIG. 14 is a graph showing the changes in the temperature and the time for heat treatment and in the gas supply observed when the device structure is heat treated after the growth without experiencing a decrease in temperature.

FIG. 14 shows the observed changes in the temperature and the time for heat treatment and in the gas supply when the device structure is heat treated after the growth without experiencing a decrease in temperature. When the DH structure was grown, hydrogen, TMG and TBAs gases were supplied to the sample in order to allow the growth of the uppermost GaAs layer. In order to prevent the desorption of As during heat treatment, only hydrogen and TBAs were supplied when the temperature was changed. Heat treatment was performed at temperatures of 700° C. and 900° C. After maintaining the heat treatment temperature for 10 minutes, the temperature was lowered to room temperature. During the cool down, the supply of TBAs was terminated at 300° C.

The luminescence intensity was measured after the heat treatment. The results are shown in Table 9.

TABLE 9

Relation between hydrogen concentration and luminescence intensity with or without heat treatment after growth of $Ga_{0.9}In_{0.1}N_{0.035}As_{0.965}$ at 530° C.

| Heat Treatment Temperature | Luminescence Intensity | Hydrogen Concentration |
|---|---|---|
| not heat treated | 0 | $1.2 \times 10^{19}$ |
| 700° C. | 19.3 | $9.2 \times 10^{18}$ |
| 900° C. | 17.2 | $2.1 \times 10^{17}$ |

As is apparent from Table 9, it was discovered that the luminescence intensity sufficient for practical use was obtained. The results of SIMS are also shown in Table 9. At 700° C., although no significant decrease in the hydrogen concentration was observed, an improvement in the luminescence intensity was observed. At 700° C., infrared absorption due to the hydrogen-nitrogen bonding was 0. At 900° C., the hydrogen concentration was reduced by at least one order of magnitude, and the luminescence intensity was also improved.

Eighth Example

The eighth example relates to the heat treatment of a structure having a low hydrogen concentration. Using the growth method described with reference to the fifth example, at the temperature of 600° C., the $GaN_{0.012}As_{0.988}$ and $Ga_{0.9}In_{0.1}N_{0.035}As_{0.965}$ DH structures were grown. A sufficient luminescence characteristic is obtained without heat treatment. Nonetheless, heat treatment was performed to improve the crystalline characteristic. As was already confirmed from the fifth example, with these growth conditions, the hydrogen concentration in this case was $5 \times 10^{18}$ atoms or below.

Heat treatment of the DH structure was performed in the hydrogen atmosphere using the heat treatment described in relation to the sixth example. The results are shown in Table 10.

TABLE 10

Changes in luminescence half-width of $GaN_{0.012}As_{0.988}$ and $Ga_{0.9}In_{0.1}N_{0.035}As_{0.965}$ heat treated after growth at 600° C. (half-width in nm)

| Heat Treatment Temperature | Luminescence Half-Width GaNAs | Luminescence Half-Width GaInNAs |
|---|---|---|
| not heat treated | 50.2 | 62.8 |
| 500° C. | 49.8 | 53.4 |
| 700° C. | 41.2 | 44.2 |
| 800° C. | 42.6 | 42.1 |
| 900° C. | 34.1 | 40.4 |
| 1100° C. | 30.9 | 38.1 |

As seen in Table 10, the five levels of heat treatment temperatures adopted were 500° C., 700° C., 800° C., 900° C., and 1100° C. At each of these temperatures, no significant changes in the luminescence intensity were observed. As the temperatures were increased, however, the luminescence intensity half-width was found to become smaller.

A similar heat treatment was performed directly after the growth of the DH structure without lowering the temperature. After growing the DH structure using the growth method described in relation to the fifth example, heat treatment was performed using the gas supply method and the temperatures used in the seventh example, i.e. 700° C. and 900° C. The results are shown in Table 11.

TABLE 11

Changes in luminescence half-width of $GaN_{0.012}As_{0.988}$ and $Ga_{0.9}In_{0.1}N_{0.035}As_{0.965}$ heat treated after growth at 600° C. without lowering temperature (half-width in nm)

| Heat Treatment Temperature | Luminescence Half-Width GaNAs | Luminescence Half-Width GaInNAs |
|---|---|---|
| not heat treated | 50.2 | 62.8 |
| 700° C. | 45.4 | 45.9 |
| 900° C. | 36.2 | 43.3 |

As is apparent from Table 11, in either case, the luminescence intensity half-width was found to become smaller. It is considered that this is due to the improvement in the crystalline characteristic brought about by heat treatment. Thus, a laser diode having a higher reliability can be formed.

As will be apparent from the above description, the advantages of the present invention according to the second embodiment include the improvements in the light-emitting characteristic and the performance reliability of a light-emitting device, and in the light-receiving sensitivity and the performance reliability of a light-receiving device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A compound semiconductor device, comprising:

a GaAs semiconductor substrate; and a semiconductor layer that is provided on said GaAs semiconductor substrate, that consists essentially of $Ga_{1-x}In_xN_yAs_{1-y}$ ($0<x\leq0.35$, $0<y\leq0.15$) and/or $GaN_yAs_{1-y}$ ($0<y\leq0.07$) together with hydrogen, and that is formed on said substrate by incorporating nitrogen into a group III–V mixed crystal semiconductor, wherein a hydrogen concentration of said hydrogen in said semiconductor layer is not greater than $5\times10^{18}$ atoms/cm$^3$.

2. A method of manufacturing a compound semiconductor device, comprising the steps of:

preparing a GaAs semiconductor substrate;

forming on said GaAs semiconductor substrate a semiconductor layer consisting of $Ga_{1-x}In_xN_yAs_{1-y}$ ($0<x\leq0.35$; $0<y\leq0.15$) and/or $GaN_yAs_{1-y}$ ($0<y\leq0.07$) together with hydrogen, said layer being formed by incorporating nitrogen into a group III–V mixed crystal semiconductor, and said layer including at least $5\times10^{18}$ atoms/cm$^3$; and heat treating said semiconductor layer at a temperature from 800° C. to 1100° C. in a gas atmosphere comprising at least one gas selected from the group consisting of arsenic-containing gases and phosphorous-containing gases to reduce a concentration of said hydrogen in said semiconductor layer.

3. A method of manufacturing a compound semiconductor device, comprising the steps of:

preparing a GaAs semiconductor substrate;

forming on said GaAs semiconductor substrate a semiconductor layer consisting of $Ga_{1-x}In_xN_yAs_{1-y}$ ($0<x\leq0.35$; $0<y\leq0.15$) and/or $GaN_yAs_{1-y}$ ($0<y\leq0.07$) together with hydrogen, said layer being formed by incorporating nitrogen into a group III–V mixed crystal semiconductor, and said layer including at least $5\times10^{18}$ atoms/cm$^3$ of said hydrogen with at least some of said hydrogen bonded to at least some of said nitrogen; and heat treating said semiconductor layer at a temperature in a range from 500° C. to below 800° C. in a gas atmosphere comprising at least one gas selected from the group consisting of arsenic-containing gases and phosphorous-containing gases, to break bonds between said nitrogen and said hydrogen in said semiconductor layer.

4. The method of manufacturing a compound semiconductor device according to claim 2, wherein said step of heat treating is performed directly after said step of forming said semiconductor layer on said substrate without lowering a temperature used during said forming.

5. The method of manufacturing a compound semiconductor device according to claim 3, wherein said step of heat treating is performed directly after said step of forming said GaAs semiconductor substrate on said semiconductor layer without lowering a temperature used during said forming.

6. A method of manufacturing a compound semiconductor device, comprising the steps of:

preparing a GaAs semiconductor substrate;

forming on said GaAs semiconductor substrate a semiconductor layer consisting of $Ga_{1-x}In_xN_yAs_{1-y}$ ($0<x\leq0.35$; $0<y\leq0.15$) and/or $GaN_yAs_{1-y}$ ($0<y\leq0.07$) and less than $5\times10^{18}$ atoms/cm$^3$ of hydrogen, and being formed by incorporating nitrogen into a group III–V mixed crystal semiconductor; and heat treating said semiconductor layer at a temperature in a range from 500° C. to 1100° C. in a gas atmosphere comprising at least one gas selected from the group consisting of arsenic-containing gases and phosphorous-containing gases, to improve crystal and optical characteristics of said semiconductor layer.

7. The method of manufacturing a compound semiconductor device according to claim 6, wherein said step of heat treating is performed directly after said step of forming said semiconductor layer on said GaAs semiconductor substrate without lowering a temperature used during said forming.

8. The method of manufacturing a compound semiconductor device according to claim 6, further comprising providing a group III source material, an arsenic-containing group V source material, and a nitrogen-containing group V source material for carrying out said forming of said semiconductor layer, and providing nitrogen gas as a carrier gas for carrying said source materials.

* * * * *

UNITED STATES PATENT AND TRADEMARK OFFICE
CERTIFICATE OF CORRECTION

PATENT NO. : 6,150,677
DATED : November 21, 2000
INVENTOR(S) : Tanaka et al.

It is certified that error appears in the above-identified patent and that said Letters Patent is hereby corrected as shown below:

Title page,
Line 2, [75], replace "Itami" by -- Itami-shi --;
Line 2, [73], replace "Osaka" by -- Osaka-si --;

Column 3,
Line 40, replace "Tertiary-butylarsine" with -- Tertiarybutylarsine --;

Column 17,
Line 4, before "hydrogen" delete "-";

Column 18,
Line 12, after " treatment," delete -- from --;

Claim 2, column 21,
Line 38, after "atoms/cm$^3$" insert -- of said hydrogen --.

Signed and Sealed this

Eighteenth Day of September, 2001

Attest:

NICHOLAS P. GODICI
Attesting Officer
*Acting Director of the United States Patent and Trademark Office*